United States Patent
Yoshihara et al.

(10) Patent No.: US 9,629,253 B2
(45) Date of Patent: *Apr. 18, 2017

(54) METHOD FOR FORMING HIGH-DEFINITION METAL PATTERN, HIGH-DEFINITION METAL PATTERN, AND ELECTRONIC COMPONENT

(71) Applicant: DIC Corporation, Tokyo (JP)

(72) Inventors: Sunao Yoshihara, Sakura (JP); Haruhiko Katsuta, Sakura (JP); Yoshinori Katayama, Sakura (JP); Jun Shirakami, Takaishi (JP); Akira Murakawa, Takaishi (JP); Wataru Fujikawa, Takaisha (JP); Yukie Saitou, Takaishi (JP)

(73) Assignee: DIC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/441,605

(22) PCT Filed: Mar. 6, 2014

(86) PCT No.: PCT/JP2014/055833
§ 371 (c)(1),
(2) Date: May 8, 2015

(87) PCT Pub. No.: WO2014/142008
PCT Pub. Date: Sep. 18, 2014

(65) Prior Publication Data
US 2015/0289383 A1 Oct. 8, 2015

(30) Foreign Application Priority Data

Mar. 12, 2013 (JP) ................................ 2013-049043

(51) Int. Cl.
| | | |
|---|---|---|
| B05D 5/12 | (2006.01) |
| H05K 3/18 | (2006.01) |
| C23C 18/30 | (2006.01) |
| H05K 1/02 | (2006.01) |
| H05K 3/20 | (2006.01) |

(52) U.S. Cl.
CPC ............. *H05K 3/182* (2013.01); *C23C 18/30* (2013.01); *H05K 1/02* (2013.01); *H05K 3/207* (2013.01); *H05K 2203/0108* (2013.01); *H05K 2203/0709* (2013.01); *H05K 2203/097* (2013.01)

(58) Field of Classification Search
USPC .......................... 428/32.34, 423.1; 523/160
See application file for complete search history.

(56) References Cited

U.S. PATENT DOCUMENTS

| | | | | |
|---|---|---|---|---|
| 2010/0113264 A1* | 5/2010 | Tsurumi | ................ | C23C 18/206 502/402 |
| 2011/0244117 A1* | 10/2011 | Saban | .................. | C09D 7/1266 427/98.4 |
| 2012/0031290 A1* | 2/2012 | Lee | .......... | B41N 1/06 101/395 |
| 2012/0031746 A1* | 2/2012 | Hwang | ................... | G06F 3/041 200/5 A |
| 2012/0177821 A1* | 7/2012 | Levey | ...................... | B01J 23/40 427/230 |

FOREIGN PATENT DOCUMENTS

| | | |
|---|---|---|
| EP | 2620290 A1 | 7/2013 |
| JP | 60-246695 A | 12/1985 |
| JP | 2005-286158 A | 10/2005 |
| JP | 2009-123791 A | 6/2009 |
| JP | 5177607 B1 | 4/2013 |
| WO | WO-2013/015056 A1 | 1/2013 |

OTHER PUBLICATIONS

International Search Report mailed Apr. 8, 2014, issued for PCT/JP2014/055833.

\* cited by examiner

*Primary Examiner* — Austin Murata
(74) *Attorney, Agent, or Firm* — Locke Lord LLP

(57) ABSTRACT

Provided are a method for forming a high-definition metal pattern which including the steps of (1) forming a receiving layer on a substrate by coating the substrate with a resin composition including a urethane resin having a weight-average molecular weight of five thousand or more or a vinyl resin and a medium, (2) forming a plating-core pattern on the receiving layer by printing an ink including a particle that serves as a plating core on the receiving layer by reverse offset printing, and (3) depositing a metal on the plating-core pattern by electroless plating, a high-definition metal pattern formed by the above-described method, and an electronic component including the high-definition metal pattern.

16 Claims, 1 Drawing Sheet

| EVALUATION | GOOD | POOR | POOR |
|---|---|---|---|
| CROSS-SECTIONAL VIEW OF PLATING CORE | | | |
| CROSS-SECTIONAL VIEW OF METAL PATTERN AFTER PLATING | CROSS-SECTIONAL SHAPE/RECTANGLE | CROSS-SECTIONAL SHAPE/CONCAVE | CROSS-SECTIONAL SHAPE/CONVEX |

METHOD FOR FORMING HIGH-DEFINITION METAL PATTERN, HIGH-DEFINITION METAL PATTERN, AND ELECTRONIC COMPONENT

TECHNICAL FIELD

The present invention relates to a method for forming a high-definition metal pattern, the method including the processes of printing a plating-core ink and depositing a metal on the resulting plating-core pattern by electroless plating and to the pattern and an electronic component including the pattern.

BACKGROUND ART

In general, high-definition metal patterns have been formed by photolithography, which is a technique that enables high-definition patterning to be achieved. However, photolithography involves many problems in that, for example, photolithography requires large-scale facilities and vast capital investment since photolithography includes the steps of deposition of a metal, application of a resist, exposure through a mask, removal of the unwanted resist, etching of the metal, and removal of the remaining resist. In addition, the complex production steps limit productivity, and the procedure in which a metal film is formed over the entire surface and subsequently the unwanted portion of the metal film is removed increases the material cost and increases the environmental load.

Accordingly, there has recently been an attempt to form a high-definition metal pattern by a printing method in order to address the problems of the facility cost, material cost, and productivity in photolithography. However, metal patterns formed by a printing method have not yet been in actual use because, for example, they have lower definition than metal patterns formed by photolithography.

In order to address the problems of facility cost, material cost, and productivity in photolithography, attention has been focused on a technique in which a printing process and a plating process are used in combination (e.g., a metal-pattern-forming technique in which the surface of a support is coated with a conductive ink including a conductive substance such as silver or with a plating-core agent, the resulting coating film is fired to form a plating-core pattern, and subsequently the surface of the plating-core pattern is subjected to a plating process to deposit a metal film on the surface of the plating-core pattern) (e.g., see PTLs 1, 2, and 3).

The cross-sectional shape of the plating-core pattern affects the cross-sectional shape of the metal pattern. For example, if a metal is deposited on a plating-core pattern having an irregular cross-sectional shape, the surface of the resulting metal pattern would have a cross-sectional shape corresponding to the irregularities of the cross-sectional shape of the plating-core pattern.

For example, when the plating-core pattern is formed by screen printing, which is a technique that may cause undulations due to the matrix of mesh, undulations may occur also in the surface of the resulting metal pattern and, as a result, the metal pattern may have a D-shaped cross section or a coffee-stain-shaped cross section. When a plating-core pattern is formed by IJ printing, the resulting metal pattern also has a D-shaped or coffee-stain-shaped cross section. The unevenness of thickness in a metal pattern may cause various problems.

The metal pattern, which is a laminated body including a plating-core pattern, requires good adhesion at each interface among a printing object, the plating-core pattern, and the plating-core pattern. However, a laminated body that satisfies all the above requirements has not yet been developed.

CITATION LIST

Patent Literature

PTL 1: Japanese Unexamined Patent Application Publication No. 60-246695
PTL 2: Japanese Unexamined Patent Application Publication No. 2005-286158
PTL 3: Japanese Patent Publication No. 2009-123791

SUMMARY OF INVENTION

Technical Problem

In light of such current realities, an object of the present invention is to provide a method for forming a high-definition metal pattern having a good cross-sectional shape by using a technique in which a printing process and a plating process are used in combination and to provide a high-definition metal pattern enabling sufficient adhesion at each interface between layers constituting a laminated body including a plating-core pattern to be suitably used for producing high-definition electronic components and a method for producing the high-definition metal pattern.

Solution to Problem

The inventors of the present invention have conducted extensive studies in light of such current realities and, as a result, found that the laminated body including a plating-core pattern has good interlaminar adhesion and a high-definition metal pattern having a good cross-sectional shape comparable to that of a metal pattern formed by photolithography can be formed when a plating-core pattern is printed on a specific resin layer by reverse offset printing to form a pattern on the resin layer and subsequently the pattern is subjected to electroless plating. Thus, the present invention was made.

Specifically, the present invention provides a method for forming a high-definition metal pattern, the method including the steps of (1) forming a receiving layer (A) on a substrate by coating the substrate with a resin composition (a), the resin composition (a) including a urethane resin (a1) having a weight-average molecular weight of five thousand or more or a vinyl resin (a2), and a medium (a3); (2) forming a plating-core pattern (B) on the receiving layer (A) by printing an ink (b) on the receiving layer (A) by reverse offset printing, the ink (b) including a particle (b1) that serves as a plating core; and (3) depositing a metal on the plating-core pattern formed in step (2) by electroless plating.

Advantageous Effects of Invention

The method according to the present invention, which includes patterning a plating-core ink by reverse offset printing and depositing a metal on the resulting plating-core pattern by a plating process, enables a high-definition metal pattern having a good cross-sectional shape comparable to

DESCRIPTION OF EMBODIMENTS

Figures 1, 2:
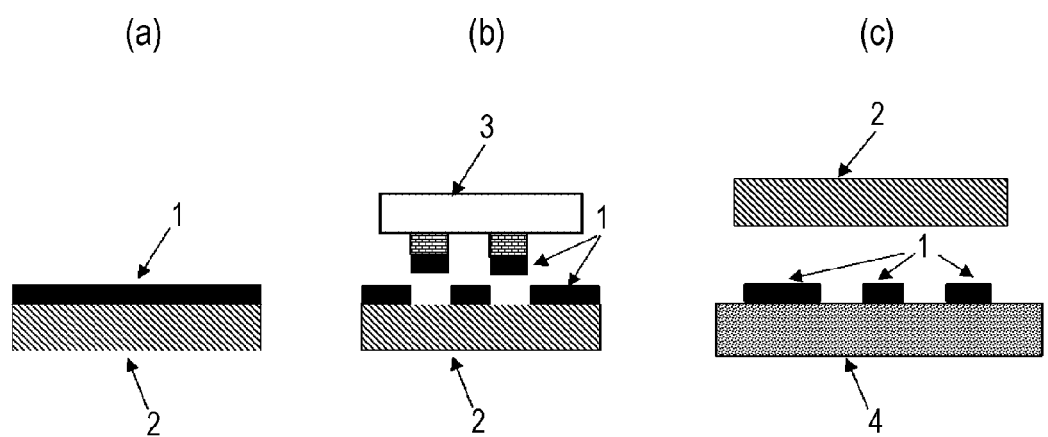
FIG. 1 is a diagram illustrating a fundamental process of reverse offset printing.
FIG. 2 illustrates the results of observing the cross-sectional shapes of metal patterns using an optical interference microscope.

The method for forming a high-definition metal pattern according to the present invention is described in detail below.

The first step according to the present invention is a step of forming a receiving layer (A) on a substrate by coating the substrate with a resin composition (a), the resin composition (a) including a urethane resin (a1) having a weight-average molecular weight of five thousand or more or a vinyl resin (a2), and a medium (a3). Through the first step, an object to which a pattern is transferred by reverse offset printing in the second step is prepared.

Examples of the substrate used in the first step include, but are not particularly limited to, insulating supports and porous insulating supports composed of a polyimide resin, a polyamide imide resin, a polyamide resin, a polyethylene terephthalate resin, a polyethylene naphthalate resin, a polycarbonate resin, an acrylonitrile-butadiene-styrene (ABS) resin, an acrylic resin such as polymethyl (meth)acrylate, a polyvinylidene fluoride resin, a polyvinyl chloride resin, a polyvinylidene chloride resin, a polyvinyl alcohol resin, a polyethylene resin, a polypropylene resin, a polyurethane resin, cellulose nanofibers, silicone, a ceramic, or glass.

The substrate may also be composed of synthetic fibers such as polyester fibers, polyamide fibers, or aramid fibers, natural fibers such as cotton or hemp, or the like. The above fibers may optionally be preprocessed.

The substrate is preferably composed of a polyimide resin, polyethylene terephthalate, polyethylene naphthalate, glass, cellulose nanofibers, or the like, which are commonly used as a material for supports on which metal patterns are formed in the production of electronic components and the like.

The substrate is preferably relatively flexible and, for example, bendable in order to increase the flexibility of the metal pattern and to produce a bendable end-product. Specifically, a uniaxially-drawn film or sheet-like substrate is preferably used.

The film or sheet-like substrate is preferably a polyethylene terephthalate film, a polyimide film, a polyethylene naphthalate film, or the like.

The thickness of the substrate is preferably about 1 to 200 μm in order to reduce the weights and thicknesses of the resulting metal pattern and an end-product including the metal pattern, such as an electronic component.

In the first step according to the present invention, it is necessary to form the receiving layer (A) on the substrate by coating the substrate with the resin composition (a). Forming the receiving layer (A) on the substrate reduces the risk of the delamination between, for example, the substrate and the plating-core pattern which may occur in the subsequent steps, in particular, due to chemicals and the like used in an electroless plating step. This enables a highly reliable metal pattern to be formed.

The resin composition (a) includes a urethane resin (a1) having a weight-average molecular weight of five thousand or more or a vinyl resin (a2), and a medium (a3) in which the urethane resin (a1) or vinyl resin (a2) is dispersed or dissolved.

When an ink including particles (b1) that serve as plating cores, which is described below, is brought into contact with the surface of the coating film (receiving layer), which is formed by coating the substrate with the resin composition (a), the coating film absorbs the medium and supports the particles that serve as plating cores on the surface of the coating film.

Subsequently, a laminated structure including the plating-core pattern and the receiving layer is formed through steps including heating. Through the above-described steps, a metal pattern having sufficient adhesion at the interface between the plating-core pattern and the receiving layer to prevent delamination from occurring at the interface over time can be formed.

<Resin Composition (a)>

The resin composition (a) used in the present invention includes a urethane resin (a1) or a vinyl resin (a2), and a medium (a3). The resin composition (a) may further include other additives as needed.

Examples of the urethane resin (a1) include a urethane resin having a polyether structure, a urethane resin having a polycarbonate structure, and a urethane resin having an aliphatic polyester structure. An example of the vinyl resin (a2) is an acrylic resin.

The urethane resin (a1) and the vinyl resin (a2) may be used in combination. In such a case, the urethane resin (a1) and the vinyl resin (a2) are preferably used so that the ratio of the urethane resin (a1) to the vinyl resin (a2) [(a1)/(a2)] is 90/10 to 10/90 and are suitably used so that the ratio of the urethane resin (a1) to the vinyl resin (a2) [(a1)/(a2)] is 70/30 to 10/90. The resin composition (a) used in the present invention preferably includes composite resin particles each constituted by a shell layer including the urethane resin (a1) and by a core layer including the vinyl resin (a2) in order to increase adhesion and the like.

The total content of the urethane resin (a1) and the vinyl resin (a2) in the composition (a) is preferably 10% to 70% by mass and is more preferably 10% to 50% by mass in order to maintain ease of coating and the like.

Examples of the medium (a3) that can be added to the composition (a) include various organic solvents and aqueous media.

Examples of the organic solvents include toluene, ethyl acetate, and methyl ethyl ketone. Examples of the aqueous media include water, water-miscible organic solvents, and a mixture of water and a water-miscible organic solvent.

Examples of the water-miscible organic solvents include alcohols such as methanol, ethanol, n-propanol, isopropanol, ethyl carbitol, ethyl cellosolve, and butyl cellosolve; ketones such as acetone and methyl ethyl ketone; polyalkylene glycols such as ethylene glycol, diethylene glycol, and propylene glycol; alkyl ethers such as polyalkylene glycol; and lactams such as N-methyl-2-pyrrolidone.

The medium (a3) included in the composition (a) used in the present invention may be water alone, a mixture of water and a water-miscible organic solvent, or a water-miscible organic solvent alone. However, the medium (a3) is preferably water alone or a mixture of water and a water-miscible organic solvent and is particularly preferably water alone from the viewpoints of safety and environmental load.

When the medium (a3) is an aqueous medium, the urethane resin (a1) or vinyl resin (a2) is preferably a resin including hydrophilic groups in order to enhance the water-dispersion stability and preservation stability of the composition (a).

Examples of the hydrophilic groups include anionic groups, cationic groups, and nonionic groups. The hydrophilic groups are more preferably anionic groups.

Examples of the anionic groups include carboxyl groups, carboxylate groups, sulfonic acid groups, and sulfonate groups. In particular, in order to increase the water-dispersibility of the resin, some or all of the anionic groups are preferably carboxylate groups or sulfonate groups that are formed by neutralizing carboxyl groups or sulfonic groups with a basic compound.

Examples of the basic compound that can be used for neutralizing the anionic groups include ammonia; organic amines such as triethylamine, pyridine, and morpholine; alkanolamines such as monoethanolamine; and metal basic compounds including sodium, potassium, lithium, or calcium. However, the metal salt compounds may reduce ease of depositing a metal by plating during the formation of a plating-core pattern. Thus, the basic compound is preferably ammonia, an organic amine, or an alkanolamine.

When the anionic groups are the carboxylate groups or sulfonate groups, the content of the anionic groups is preferably 50 to 2000 mmol/kg relative to the total amount of the resin in order to increase the water-dispersion stability of the resin.

An example of the cationic groups is tertiary amino groups.

Examples of an acid that can be used for neutralizing some or all of the tertiary amino groups include organic acids such as acetic acid, propionic acid, lactic acid, and maleic acid; sulfonic acids such as sulfonic acid and methanesulfonic acid; and inorganic acids such as hydrochloric acid, sulfuric acid, orthophosphoric acid, and orthophosphorous acid. However, chlorine and sulfur may reduce ease of depositing a metal by plating during the formation of a plating-core pattern or the like. Thus, acetic acid, propionic acid, lactic acid, maleic acid, and the like are preferably used.

Examples of the nonionic groups include polyoxyethylene groups, polyoxypropylene groups, polyoxybutylene groups, poly(oxyethylene-oxypropylene) groups, and polyoxyalkylene groups such as polyoxyethylene-polyoxypropylene groups. In particular, polyoxyalkylene groups having an oxyethylene unit are preferably used in order to further enhance hydrophilicity.

The urethane resin (a1) may be a urethane resin produced by reacting a polyol, a polyisocyanate, and, as needed, a chain-extending agent. In particular, in order to further increase adhesion, the urethane resin (a1) is preferably a urethane resin having a polyether structure, a urethane resin having a polycarbonate structure, or a urethane resin having an aliphatic polyester structure.

The polyether structure, the polycarbonate structure, and the aliphatic polyester structure are preferably derived from polyols used for producing the urethane resin. Specifically, a urethane resin having the polyether structure is preferably produced using a polyol including the polyether polyol described below, a urethane resin having the polycarbonate structure is preferably produced using a polyol including the polycarbonate polyol described below, and a urethane resin having the aliphatic polyester structure is preferably produced using a polyol including the aliphatic polyester polyol described below.

As described above, examples of the polyol that can be used for producing the urethane resin (a1) include a polyether polyol, a polycarbonate polyol, and an aliphatic polyester polyol. The above-described polyols may be used in combination with other polyols as needed.

An example of the polyether polyol is a polyether polyol produced by addition polymerization of an alkylene oxide using, as an initiator, one or more compounds having two or more active hydrogen atoms.

Examples of the initiators include ethylene glycol, diethylene glycol, triethylene glycol, propylene glycol, trimethylene glycol, 1,3-butanediol, 1,4-butanediol, 1,6-hexanediol, neopentyl glycol, glycerin, trimethylolethane, and trimethylolpropane.

Examples of the alkylene oxide include ethylene oxide, propylene oxide, butylene oxide, styrene oxide, epichlorohydrin, and tetrahydrofuran.

Examples of the polycarbonate polyol include a polycarbonate polyol produced by reacting a carbonic ester with a polyol and a polycarbonate polyol produced by reacting phosgene with bisphenol A or the like.

Examples of the carbonic ester include methyl carbonate, dimethyl carbonate, ethyl carbonate, diethyl carbonate, cyclocarbonate, and diphenyl carbonate.

Examples of the polyol that reacts with the carbonic ester include dihydroxy compounds having a relatively low molecular weight, such as ethylene glycol, diethylene glycol, triethylene glycol, 1,2-propylene glycol, 1,3-propylene glycol, dipropylene glycol, 1,4-butanediol, 1,3-butanediol, 1,2-butanediol, 2,3-butanediol, 1,5-pentanediol, 1,5-hexanediol, 2,5-hexanediol, 1,6-hexanediol, 1,7-heptanediol, 1,8-octanediol, 1,9-nonanediol, 1,10-decanediol, 1,11-undecanediol, 1,12-dodecanediol, 3-methyl-1,5-pentanediol, 2-ethyl-1,3-hexanediol, 2-methyl-1,3-propanediol, 2-methyl-1,8-octanediol, 2-butyl-2-ethylpropanediol, neopentyl glycol, hydroquinone, resorcine, bisphenol-A, bisphenol-F, and 4,4'-biphenol.

Examples of the aliphatic polyester polyol include an aliphatic polyester polyol produced by an esterification reaction of a low-molecular-weight polyol with a polycarboxylic acid; an aliphatic polyester produced by a ring-opening polymerization reaction of a cyclic ester compound such as ε-caprolactone or γ-butyrolactone; and copolyesters of the above-described aliphatic polyesters.

Examples of the low-molecular-weight polyol that can be used for producing the polyester polyol include ethylene glycol, 1,2-propanediol, 1,3-butanediol, 1,4-butanediol, 1,6-hexanediol, 3-methyl-1,5-pentanediol, neopentyl glycol, diethylene glycol, dipropylene glycol, glycerin, trimethylolpropane, and 1,4-cyclohexanedimethanol. The above-described low-molecular-weight polyols may be used alone or in combination of two or more. It is preferable to use ethylene glycol, 1,2-propanediol, 1,3-butanediol, or 1,4-butanediol in combination with 3-methyl-1,5-pentanediol or neopentyl glycol.

Examples of the polycarboxylic acid include succinic acid, adipic acid, sebacic acid, dodecanedicarboxylic acid, azelaic acid, anhydrides of these acids, and esters of these acids. It is preferable to use an aliphatic polycarboxylic acid such as adipic acid.

The number-average molecular weights of the polyether polyol, the polycarbonate polyol, and the aliphatic polyester polyol are preferably 500 to 4000 and are more preferably 500 to 2000.

As needed, polyols other than the above-described polyols may be used in combination with the above-described polyols for producing the urethane resin (a1).

Examples of the other polyols that may be used as needed include ethylene glycol, 1,2-propanediol, 1,3-butanediol, 1,4-butanediol, 3-methyl-1,5-pentanediol, 1,6-hexanediol, 1,4-cyclohexanedimethanol, neopentyl glycol, diethylene glycol, dipropylene glycol, glycerin, trimethylolpropane, an acrylic polyol produced by introducing hydroxyl groups to an acrylic copolymer, polybutadiene polyol, hydrogenated polybutadiene polyol, and a partially saponified ethylene-vinyl acetate copolymer.

When the urethane resin (a1) to be produced is a urethane resin including hydrophilic groups, the other polyol is preferably a polyol including hydrophilic groups.

Examples of the polyol including hydrophilic groups include polyols including carboxyl groups, such as 2,2-dimethylolpropionic acid, 2,2-dimethylolbutanoic acid, and 2,2-dimethylolvaleric acid; and polyols including sulfonic acid groups, such as 5-sulfoisophthalic acid, sulfoterephthalic acid, 4-sulfophthalic acid, and 5[4-sulfophenoxy]isophthalic acid. Another example of the polyol including hydrophilic groups is a polyester polyol including hydrophilic groups which is produced by reacting the above-described low-molecular-weight polyol including hydrophilic groups with, for example, a polycarboxylic acid such as adipic acid.

The amount of the polyol including hydrophilic groups used is preferably 0.1% to 10% by mass of the total amount of polyols used for producing the urethane resin (a1).

Examples of polyisocyanates that can be used for the reaction with the polyol include polyisocyanates having an aromatic structure, such as 4,4'-diphenylmethane diisocyanate, 2,4'-diphenylmethane diisocyanate, carbodiimide-modified diphenylmethane diisocyanate, crude diphenylmethane diisocyanate, phenylene diisocyanate, tolylene diisocyanate, and naphthalene diisocyanate; and aliphatic polyisocyanates and polyisocyanates having an alicyclic structure, such as hexamethylene diisocyanate, lysine diisocyanate, cyclohexane diisocyanate, isophorone diisocyanate, dicyclohexylmethane diisocyanate, xylylene diisocyanate, and tetramethylxylylene diisocyanate. In particular, polyisocyanates having an alicyclic structure are preferably used.

Examples of the chain-extending agent that can be used for producing the urethane resin include polyamines, hydrazine compounds, and other compounds including active hydrogen atoms.

Examples of the polyamines include diamines such as ethylenediamine, 1,2-propanediamine, 1,6-hexamethylenediamine, piperazine, 2,5-dimethylpiperazine, isophoronediamine, 4,4'-dicyclohexylmethanediamine, 3,3'-dimethyl-4,4'-dicyclohexylmethanediamine, and 1,4-cyclohexanediamine; N-hydroxymethylaminoethylamine; N-hydroxyethylaminoethylamine; N-hydroxypropylaminopropylamine; N-ethylaminoethylamine; N-methylaminopropylamine; diethylenetriamine; dipropylenetriamine; and triethylenetetramine. It is preferable to use ethylenediamine.

Examples of the hydrazine compounds include hydrazine, N,N'-dimethylhydrazine, 1,6-hexamethylenebishydrazine, succinic acid dihydrazide, adipic acid dihydrazide, glutaric acid dihydrazide, sebacic acid dihydrazide, isophthalic acid dihydrazide, β-semicarbazide propionic acid hydrazide, 3-semicarbazide-propyl-carbazic acid ester, and semicarbazide-3-semicarbazidemethyl-3,5,5-trimethylcyclohexane.

Examples of the other compounds including active hydrogen atoms include glycols such as ethylene glycol, diethylene glycol, triethylene glycol, propylene glycol, 1,3-propanediol, 1,3-butanediol, 1,4-butanediol, hexamethylene glycol, saccharose, methylene glycol, glycerin, and sorbitol; phenols such as bisphenol A, 4,4'-dihydroxydiphenyl, 4,4'-dihydroxydiphenyl ether, 4,4'-dihydroxydiphenylsulfone, hydrogenated bisphenol A, and hydroquinone; and water.

The chain-extending agent is preferably used so that, for example, the equivalence ratio of amino groups included in the polyamine to isocyanate groups is 1.9 or less (equivalence ratio). The chain-extending agent is more preferably used so that, for example, the equivalence ratio of amino groups included in the polyamine to isocyanate groups is 0.3 to 1 (equivalence ratio).

The urethane resin (a1) may be produced by reacting the polyol, the polyisocyanate, and, as needed, the chain-extending agent using a known method, for example, in the absence of a solvent or in the presence of an organic solvent.

The reaction of the polyol with the polyisocyanate is conducted preferably at 50° C. to 120° C. and more preferably at 80° C. to 100° C. with great caution paid to rapid heating, foaming, and the like and consideration given to safety. The polyol and the polyisocyanate may be mixed together at once. Alternatively, one of them may be successively added to the other by dropping or the like. The reaction of the polyol with the polyisocyanate is continued for about 1 to 15 hours.

A water dispersion of the urethane resin (a1), which can be used as the above-described composition (a), can be formed in the following manner: the polyol is reacted with the polyisocyanate, and, as needed, the chain-extending agent by the above-described method to prepare a urethane resin (a1); subsequently some or all of the hydrophilic groups included in the urethane resin (a1), such as anionic groups, are neutralized as needed; and the resulting urethane resin (a1) is mixed with an aqueous medium that serves as a solvent of the composition (a).

More specifically, the polyol is reacted with the polyisocyanate by the above-described method to prepare a urethane prepolymer including terminal isocyanate groups. As needed, some or all of the hydrophilic groups, such as anionic groups, included in the urethane prepolymer are neutralized. Subsequently, the urethane prepolymer is mixed with an aqueous medium and, as needed, chain extension is performed using the chain-extending agent. Thus, a water dispersion of a urethane resin which includes the urethane resin (a1) dispersed or dissolved in an aqueous medium can be formed. The water dispersion can be used as the composition (a).

The polyisocyanate is preferably reacted with the polyol so that, for example, the equivalence ratio of isocyanate groups included in the polyisocyanate to hydroxyl groups included in the polyol [isocyanate groups/hydroxyl groups] is 0.9 to 2.

An organic solvent may also be used as a solvent for producing the urethane resin (a1).

Examples of the organic solvent include ketones such as acetone and methyl ethyl ketone; ethers such as tetrahydrofuran and dioxane; acetic acid esters such as ethyl acetate and butyl acetate; nitriles such as acetonitrile; and amides such as dimethylformamide and N-methylpyrrolidone. The above-described organic solvents may be used alone or in combination of two or more.

The organic solvent is preferably removed by distillation or the like after the urethane resin (a1) is prepared. However, when the composition (a) includes the urethane resin (a1) and an organic solvent, the organic solvent used for preparing the urethane resin (a1) may be used also as a solvent of the composition (a).

The weight-average molecular weight of the urethane resin (a1) needs to be 5000 or more, is preferably 500000 or less, and is more preferably 20000 to 100000 in order to form the plating-core pattern having good adhesion.

Introducing functional groups that react with an organic compound included in the ink (b) described below, the organic compound serving as an agent used for protecting particles that serve as plating cores included in the ink (b), to the urethane resin (a1) further increases the interlaminar adhesion between the receiving layer (A) and the plating-core pattern (B). Thus, functional groups included in the urethane resin (a1) are selected depending on the functional groups included in the protective agent included in the ink used. In general, such reactive functional groups are introduced to the urethane resin (a1) by, for example, using a polyol including the functional groups as the polyol that can be used for preparing the urethane resin (a1). For example, when the functional groups to be introduced to the urethane resin (a1) are keto groups, keto groups can be introduced to the urethane resin (a1) by, for example, using a polyol including keto groups as the polyol that can be used for preparing the urethane resin (a1).

When the functional groups to be introduced to the urethane resin (a1) are epoxy groups, epoxy groups can be introduced to the urethane resin (a1) by, for example, using a polyol including epoxy groups as the polyol that can be used for preparing the urethane resin (a1).

When the functional groups to be introduced to the urethane resin (a1) are carboxylic acid groups, carboxylic acid groups can be introduced to the urethane resin (a1) by, for example, using a polyol including carboxyl groups as the polyol that can be used for preparing the urethane resin (a1).

When the functional groups to be introduced to the urethane resin (a1) are isocyanate groups or blocked isocyanate groups, such functional groups can be introduced to the urethane resin (a1) by, for example, reacting the polyol with the polyisocyanate to prepare the urethane resin (a1) so that the isocyanate groups remain or by forming the isocyanate groups into blocked isocyanate groups using an agent such as methyl ethyl ketone oxime.

The content of the functional groups included in the urethane resin (a1) which are capable of crosslinking with reactive functional groups included in the protective agent included in the ink (b) is preferably 50 to 5000 mmol/kg relative to the total amount of the urethane resin (a1).

The urethane resin (a1) may further include, in addition to the above-described functional groups, for example, crosslinkable functional groups such as alkoxysilyl groups, silanol groups, hydroxyl groups, or amino groups.

The crosslinkable functional groups are capable of forming a crosslinked structure in the receiving layer (A) on which the plating-core ink is supported, which enables a highly durable plating-core pattern to be formed.

The alkoxysilyl groups and the silanol groups can be introduced to the urethane resin (a1) by using γ-aminopropyltriethoxysilane or the like for producing the urethane resin (a1).

The urethane resin (a1) is preferably a urethane resin having an alicyclic structure in order to increase durability to such an extent that peeling of a primer-resin layer and the plating-core pattern from the support, which may be caused by using a plating chemical agent including a highly alkaline or highly acidic substance in a plating step of the electroless plating process described below, can be prevented from occurring.

Examples of the alicyclic structure include a cyclobutyl group, a cyclopentyl group, a cyclohexyl group, a cycloheptyl group, a cyclooctyl group, a propylcyclohexyl group, a tricyclo[5,2,1,0,2,6]decyl group, a bicyclo[4,3,0]-nonyl group, a tricyclo[5,3,1,1]dodecyl group, a propyltricyclo[5,3,1,1]dodecyl group, a norbornene group, an isobornyl group, a dicyclopentanyl group, and an adamantyl group. In particular, the alicyclic structure is preferably a cyclohexyl group, a norbornene group, an isobornyl group, or an adamantyl group in order to form a highly durable plating-core pattern.

The above-described alicyclic structure can be introduced to the urethane resin (a1) by using a polyisocyanate having the alicyclic structure or a polyol having an alicyclic structure as a polyisocyanate or a polyol used for producing the urethane resin (a1). In particular, a urethane resin having an alicyclic structure which is derived from a polyol having an alicyclic structure is preferably used. A urethane resin having an alicyclic structure which is derived from a polyisocyanate having an alicyclic structure and a polyol having an alicyclic structure is particularly preferably used in order to markedly increase the adhesion of the receiving layer (A) to the substrate. The content of the alicyclic structure in the urethane resin (a1) is preferably 2000 to 5500 mmol/kg and is particularly preferably 3000 to 5000 mmol/kg relative to the total amount of the urethane resin (a1) in order to increase the adhesion of the resin to the substrate, that is, specifically, to prevent the receiving layer from being peeled off from the substrate in the plating process to enhance durability.

An example of the vinyl resin (a2) included in the composition (a) is a polymer prepared from monomers including a polymerizable unsaturated double bond. Specific examples of such a polymer include polyethylene, polypropylene, polybutadiene, an ethylene-propylene copolymer, a natural rubber, a synthetic isopropylene rubber, an ethylene-vinyl acetate copolymer, and an acrylic resin. In particular, when the particles (b1) that serve as plating cores are protected using an organic compound as described above, the vinyl resin (a2) is preferably an acrylic resin in order to make it easy to introduce functional groups capable of crosslinking with the organic compound.

Examples of the acrylic resin include polymers and copolymers produced by polymerizing a (meth)acrylic monomer. Note that the term "(meth)acrylic monomer" used herein refers to one of or both acrylic monomer and methacrylic monomer, the term "(meth)acrylic acid" used herein refers to one of or both acrylic acid and methacrylic acid, and the term "(meth)acrylate" used herein refers to one of or both acrylate and methacrylate.

Examples of the (meth)acrylic monomer include (meth)acrylic acid esters such as methyl (meth)acrylate, ethyl (meth)acrylate, n-butyl (meth)acrylate, i-butyl (meth)acrylate, t-butyl (meth)acrylate, 2-ethylhexyl (meth)acrylate, hexyl (meth)acrylate, cyclohexyl (meth)acrylate, octyl (meth)acrylate, nonyl (meth)acrylate, dodecyl (meth)acrylate, stearyl (meth)acrylate, isobornyl (meth)acrylate, norbornyl (meth)acrylate, tricyclodecanyl (meth)acrylate, adamantyl (meth)acrylate, dicyclopentanyl (meth)acrylate, phenyl (meth)acrylate, and benzyl (meth)acrylate; (meth)acrylic acid alkyl esters such as 2,2,2-trifluoroethyl (meth)acrylate, 2,2,3,3-pentafluoropropyl (meth)acrylate, perfluorocyclohexyl (meth)acrylate, 2,2,3,3,-tetrafluoropropyl (meth)acrylate, β-(perfluorohexyl)ethyl (meth)acrylate, (poly)ethylene glycol di(meth)acrylate, (poly)propylene glycol di(meth)acrylate, (poly)butylene glycol di(meth)acrylate, (poly)neopentyl glycol di(meth)acrylate, and N,N'-methylenebis(meth)acrylamide; and tricyclodecanedimethanol diacrylate.

In particular, among the above-described acrylic resins, an acrylic resin prepared by polymerizing a vinyl monomer mixture of 10% to 70% by mass of methyl methacrylate and 10% to 50% by mass of (meth)acrylic acid alkyl ester including an alkyl group having 2 to 12 carbon atoms is preferably used in order to further increase the adhesion of the receiving layer (A) to the substrate and to the plating-core pattern.

Functional groups that react with and bond to an organic compound used as an agent for protecting the particles (b1) that serve as plating cores, which are described below, may be introduced to the vinyl resin (a2) by, for example, using a monomer having the functional groups as the monomer having a polymerizable unsaturated double bond. For example, when the functional groups to be introduced to the vinyl resin (a2) are keto groups, a monomer including keto groups, such as diacetoneacrylamide, may be used.

When the functional groups to be introduced to the vinyl resin (a2) are acetoacetoxy groups, for example, 2-acetoacetoxyethyl (meth)acrylate may be used.

When the functional groups to be introduced to the vinyl resin (a2) are epoxy groups, for example, glycidyl (meth) acrylate or allyl glycidyl (meth)acrylate may be used.

When the functional groups to be introduced to the vinyl resin (a2) are acidic groups or acid anhydride groups, examples of compounds that can be used include monomers including carboxylic groups and anhydrides thereof, such as acrylic acid, methacrylic acid, β-carboxyethyl (meth)acrylate, 2-(meth)acryloylpropionic acid, crotonic acid, itaconic acid, maleic acid, fumaric acid, half esters of itaconic acid, half esters of maleic acid, maleic anhydride, itaconic anhydride, citraconic anhydride, β-(meth)acryloyloxyethyl hydrogen succinate, citraconic acid, half esters of citraconic acid, citraconic anhydride.

When the functional groups to be introduced to the vinyl resin (a2) are isocyanate groups or blocked isocyanate groups, examples of compounds that can be used include monomers including isocyanate groups and blocked monomers including isocyanate groups, such as (meth)acryloyl isocyanate, (meth)acryloyl isocyanateethyl, and phenol-adducts and methylethyl-ketoxime-adducts of these monomers.

When the functional groups to be introduced to the vinyl resin (a2) are N-alkylol groups, examples of compounds that can be used include N-methylol(meth)acrylamide, N-methoxymethyl(meth)acrylamide, N-ethoxymethyl (meth)acrylamide, N-propoxymethyl(meth)acrylamide, N-isopropoxymethyl(meth)acrylamide, N-n-butoxymethyl (meth)acrylamide, N-isobutoxymethyl(meth)acrylamide, N-pentoxymethyl(meth)acrylamide, N-ethanolacrylamide, and N-propanolacrylamide.

The acrylic resin may include, as needed, crosslinkable functional groups such as amide groups, hydroxyl groups, amino groups, silyl groups, aziridinyl groups, oxazoline groups, and cyclopentenyl groups.

Examples of a monomer that can be used for introducing the crosslinkable functional groups to the vinyl resin (a2) such as an acrylic resin include vinyl monomers including hydroxyl groups, such as (meth)acrylamide, 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, (4-hydroxymethylcyclohexyl)methyl (meth)acrylate, glycerol (meth)acrylate, polyethylene glycol (meth)acrylate, and N-hydroxyethyl(meth) acrylamide: vinyl monomers including amino groups, such as aminoethyl (meth)acrylate, dimethylaminoethyl (meth) acrylate, N-monoalkylaminoalkyl (meth)acrylate, and N,N-dialkylaminoalkyl (meth)acrylate; polymerizable monomers including silyl groups, such as vinyltrichlorosilane, vinyltrimethoxysilane, vinyltriethoxysilane, vinyltris(β-methoxyethoxy)silane, γ-(meth)acryloxypropyltrimethoxysilane, γ-(meth)acryloxypropyltriethoxysilane, γ-(meth)acryloxypropylmethyldimethoxysilane, γ-(meth)acryloxypropylmethyldiethoxysilane, γ-(meth)acryloxypropyltriisopropoxysilane, N-β-(N-vinylbenzylaminoethyl)-γ-aminopropyltrimethoxysilane, and hydrochlorides of these polymerizable monomers; polymerizable monomers including aziridinyl groups, such as 2-aziridinylethyl (meth)acrylate; polymerizable monomers including oxazoline groups, such as 2-isopropenyl-2-oxazoline and 2-vinyl-2-oxazoline; polymerizable monomers including cyclopentenyl groups, such as dicyclopentenyl (meth)acrylate; and polymerizable monomers including carbonyl groups, such as acrolein and diacetone(meth)acrylamide.

Examples of compounds that can be used in combination with the above-described (meth)acrylic monomer and the like for producing the vinyl resin (a2) include vinyl acetate, vinyl propionate, vinyl butyrate, vinyl versatate, methyl vinyl ether, ethyl vinyl ether, propyl vinyl ether, butyl vinyl ether, amyl vinyl ether, hexyl vinyl ether, (meth)acrylonitrile, styrene, α-methylstyrene, vinyltoluene, vinylanisole, α-halostyrene, vinylnaphthalene, divinylstyrene, isoprene, chloroprene, butadiene, ethylene, tetrafluoroethylene, vinylidene fluoride, N-vinylpyrrolidone, polyethylene glycol mono(meth)acrylate, glycerol mono(meth)acrylate, vinylsulfonic acid, styrenesulfonic acid, allylsulfonic acid, 2-methylallylsulfonic acid, 2-sulfoethyl (meth)acrylate, 2-sulfopropyl (meth)acrylate, "ADEKA REASOAP PP-70 and PPE-710" (produced by ADEKA CORPORATION), and salts and the like of the above-described compounds.

The vinyl resin (a2) such as an acrylic resin can be produced by polymerizing a mixture of the above-described monomers having a polymerizable unsaturated double bond by any method known in the related art. However, it is preferable to employ an emulsion polymerization method in order to produce a plating-core pattern having good adhesion.

Examples of an emulsion polymerization method that can be employed for preparing the vinyl resin (a2) include the following methods: a method in which water, a mixture of monomers having a polymerizable unsaturated double bond, a polymerization initiator, and, as needed, a chain-transfer agent, an emulsifier, a dispersion stabilizer, and the like are charged into a reaction container at the same time and mixed together to cause polymerization; a monomer-dropping method in which a mixture of monomers having a polymerizable unsaturated double bond is added dropwise into a reaction container to cause polymerization; and a pre-emulsion method in which a mixture of monomers having a polymerizable unsaturated double bond, an emulsifier or the like, and water are mixed together, and the resulting mixture is added dropwise into a reaction container to cause polymerization.

The reaction is preferably conducted at, for example, about 30° C. to about 90° C. for about 1 to 10 hours by an emulsion polymerization method, which vary depending on the types of the monomers having a polymerizable unsaturated double bond, such as a (meth)acrylic monomer, and the polymerization initiator used.

Examples of the polymerization initiator include persulfates such as potassium persulfate, sodium persulfate, and ammonium persulfate; peroxides such as benzoyl peroxide, cumene hydroperoxide, and t-butyl hydroperoxide; and hydrogen peroxide. In order to perform a radical polymerization, the above-described peroxides may be used alone or in combination with a reducing agent such as ascorbic acid, erythorbic acid, sodium erythorbate, a metal salt of formaldehyde sulfoxylate or the like, sodium thiosulfate, sodium bisulfite, or ferric chloride. It is also possible to use an azo initiator such as 4,4'-azobis(4-cyanovaleric acid) or 2,2'-azobis (2-amidinopropane) dihydrochloride as a polymerization initiator.

Examples of the emulsifier that can be used for producing the vinyl resin (a2) such as an acrylic resin include an anionic surfactant, a nonionic surfactant, a cationic surfactant, and an amphoteric surfactant.

Examples of the anionic surfactant include higher-alcohol sulfates and the salts thereof, alkylbenzene sulfonates, polyoxyethylenealkylphenyl sulfonates, polyoxyethylene alkyldiphenyl ether sulfonates, sulfuric acid half-esters of polyoxyethylene alkyl ether, alkyl diphenyl ether disulfonates, and succinic acid dialkyl ester sulfonates. A specific example of the anionic surfactant is "LATEMUL E-118B" (sodium sulfate salt of polyoxyethylene alkyl ether produced by Kao Corporation). Examples of the nonionic surfactant include polyoxyethylene alkyl ether, polyoxyethylene alkylphenyl ether, polyoxyethylene diphenyl ether, a polyoxyethylene-polyoxypropylene blocked copolymer, and an acetylenediol-based surfactant.

An example of the cationic surfactant is an alkylammonium salt. Examples of the amphoteric surfactant include alkyl(amide)betaine and alkyldimethylamine oxide.

Examples of the emulsifier include, in addition to the above-described surfactants, fluorosurfactants, silicone-based surfactants, and emulsifiers generally referred to as "reactive emulsifiers", which include polymerizable unsaturated groups in the molecules.

Examples of the reactive emulsifiers include "LATEMUL S-180" (produced by Kao Corporation, reactive surfactant including sulfonic acid groups and a salt thereof); "ELEMINOL JS-2 and RS-30" (produced by Sanyo Chemical Industries, Ltd.); "AQUALON HS-10, HS-20, and KH-1025" (DKS Co. Ltd., reactive surfactant including sulfate groups or a salt thereof); "ADEKA REASOAP SE-10 and SE-20" (produced by ADEKA CORPORATION); "NEW FRONTIER A-229E" (produced by DKS Co. Ltd., reactive surfactant including phosphate groups); and "AQUALON RN-10, RN-20, RN-30, and RN-50" (produced by DKS Co. Ltd., reactive surfactant including nonionic hydrophilic groups).

An example of the chain-transfer agent that can be used for producing the vinyl resin (a2) such as an acrylic resin is lauryl mercaptan. The amount of the chain-transfer agent is preferably 0% to 1% by mass and is more preferably 0% to 0.5% by mass of the total amount of a mixture of the monomers including a polymerizable unsaturated double bond, the mixture including the above-described (meth) acrylic monomers.

When the resin included in the composition (a) is not the urethane resin (a1) but the vinyl resin (a2), the vinyl resin (a2) is preferably a vinyl resin having a weight-average molecular weight of 100 thousand or more and an acid value of 10 to 80 which is dispersed in an aqueous medium. The vinyl resin (a2) may include, as needed, one or more components (z) selected from the group consisting of water-soluble resins and fillers. In such a case, the amount of the components (z) is preferably set to 0% to 15% by mass of the total amount of the vinyl resin (a2).

The acid value of the vinyl resin (a2) is preferably 10 to 75, is more preferably 15 to 70, is further preferably 25 to 70, and is particularly preferably 35 to 70 in order to further enhance moisture-heat resistance.

When the vinyl resin is prepared in the above-described manner, the upper limit of the weight-average molecular weight of the vinyl resin is preferably, but not particularly limited to, about ten million or less and is more preferably five million or less in order to achieve adequate printability of the ink (b) described below.

The weight-average molecular weight of the vinyl resin can be generally measured by gel-permeation chromatography (GPC) using a measurement sample prepared by mixing 80 mg of the vinyl resin with 20 ml of tetrahydrofuran for 12 hours under stirring. The following equipment may be used for the measurement: Measurement apparatus: High-performance liquid chromatograph Model HLC-8220 produced by Tosoh Corporation, Columns: TSKgelGMH XL×4 columns produced by Tosoh Corporation, Eluent: Tetrahydrofuran, and Detector: RI detector.

However, if the molecular weight of the vinyl resin exceeds about one million, it may be difficult to measure the molecular weight of the vinyl resin by a standard molecular-weight-measuring method using GPC or the like.

Specifically, when 80 mg of a vinyl resin having a weight-average molecular weight of more than one million and 20 ml of tetrahydrofuran is mixed together for 12 hours under stirring, the vinyl resin may fail to completely dissolve. In such a case, when the liquid mixture is filtered through a 1-μm membrane filter, a residue of the vinyl resin is observed on the membrane filter.

The residue is derived from the vinyl resin having a molecular weight of more than about one million. Thus, it may be difficult to measure a proper weight-average molecular weight of the vinyl resin by GPC using the filtrate obtained by the filtration.

Therefore, in the present invention, when a residue is confirmed on the membrane filter after the filtration, the vinyl resin is considered to have a weight-average molecular weight of more than one million.

The vinyl resin may be dispersed in an aqueous medium. In such a case, a portion of the vinyl resin may be dissolved in the aqueous medium.

The vinyl resin including acidic groups can be readily produced using 0.2% to 15% by mass of a vinyl monomer including acidic groups relative to the total amount of the mixture of vinyl monomers. The amount of the vinyl monomer including acid groups is preferably 1.5% to 12% by mass, is more preferably 3.5% to 11% by mass, and is further preferably more than 5% by mass and 11% by mass or less relative to the total amount of the mixture of the vinyl monomers. Using a certain amount of vinyl monomers including acidic groups increases the water-dispersion stability, moisture-heat resistance, and the like of the resulting vinyl resin.

In the case where the vinyl monomer including acidic groups or, in particular, the vinyl monomer including carboxyl groups is used in combination with a vinyl monomer including amide groups, the total mass of the vinyl monomer including acidic groups and the vinyl monomer including amide groups is preferably more than 5% by mass and 40% by mass or less and is more preferably 6% by mass or more and 35% by mass or less of the total amount of the mixture of vinyl monomers used for producing the vinyl resin.

The composition (a) may be prepared by dispersing particles of a composite resin including the urethane resin (a1) and the vinyl resin (a2) in an aqueous medium.

A specific example of the composite resin particles is particles of the urethane resin (a1) each including a portion or the entirety of a particle of the vinyl resin (a2). The composite resin particles are preferably core-shell-type composite resin particles each constituted by a core layer composed of the vinyl resin and by a shell layer composed of the urethane resin including hydrophilic groups. In particular, in order to form a plating-core pattern, the core-shell-type composite resin particles are preferably used because they do not require use of a surfactant, which may reduce ease of depositing a metal by plating.

When the vinyl resin (a2) has greater hydrophilicity than the urethane resin (a1), the composite resin particles may be particles of the vinyl resin (a2) each including a portion or the entirety of a particle of the urethane resin (a1).

A covalent bonding may be formed between the urethane resin (a1) and the vinyl resin (a2), but is preferably not formed therebetween.

The core-shell-type composite resin particles are preferably urethane-acrylic composite resin particles in which the vinyl resin (a2) is an acrylic resin.

The average particle diameter of the composite resin particles is preferably 5 to 100 nm in order to achieve good water-dispersion stability. The term "average particle diameter" used herein refers to the average particle diameter measured on a volumetric basis by dynamic light scattering, which is also described in Examples below.

The ratio of the urethane resin (a1) to the vinyl resin (a2) included in the composite resin particles [urethane resin (a1)/vinyl resin (a2)] is preferably 90/10 to 10/90 and is more preferably 70/30 to 10/90.

The urethane resin constituting the composite resin particles may be the same as the above-described urethane resin (a1). Specifically, polyols, polyisocyanates, and chain-extending agents that can be used for producing the urethane resin (a1) are the same as the above-described polyols, polyisocyanates, and chain-extending agents that can be used for producing the above-described urethane resin (a1). Functional groups can be introduced to the composite resin particles to crosslink with an organic compound that serves as an agent used for protecting the particles (b) by the same method as that in which the above-described introduction of functional groups to the urethane resin (a1).

When the urethane resin constituting the composite resin particles is a urethane resin having an alicyclic structure, the polyol is preferably a polyol having an alicyclic structure and the polyisocyanate is preferably a polyisocyanate having an alicyclic structure. This enables an alicyclic structure to be introduced to the urethane resin.

Examples of the polyol having an alicyclic structure include alicyclic-structure-containing polyols having a relatively low molecular weight, such as 1,4-cyclohexanedimethanol, cyclobutanediol, cyclopentanediol, 1,4-cyclohexanediol, cycloheptanediol, cyclooctanediol, cyclohexanedimethanol, tricyclo[5,2,1,0,2,6]decanedimethanol, bicyclo[4,3,0]-nonanediol, dicyclohexanediol, tricyclo[5,3,1,1]dodecanediol, bicyclo[4,3,0]nonanedimethanol, tricyclo[5,3,1,1]dodecanediethanol, spiro[3,4]octanediol, butylcyclohexanediol, 1,1'-bicyclohexylidenediol, cyclohexanetriol, hydrogenated bisphenol A, and 1,3-adamantanediol.

Examples of the polyol having an alicyclic structure further include, in addition to the above-described polyols, polyols produced by reacting a polycarboxylic acid having an alicyclic structure with an aliphatic polyol.

Examples of the alicyclic-structure polycarboxylic acid include 1,3-cyclopentanedicarboxylic acid, 1,2-cyclohexanedicarboxylic acid, 1,3-cyclohexanedicarboxylic acid, 1,4-cyclohexanedicarboxylic acid, and anhydrates or esters of these polycarboxylic acids. In particular, polycarboxylic acids having an alicyclic structure, such as 1,2-cyclohexanedicarboxylic acid and 1,4-cyclohexanedicarboxylic acid are preferably used.

Examples of the polyol that can be used for the esterification reaction with the alicyclic-structure polycarboxylic acid include aliphatic polyols such as the above-described 1,6-hexanediol, ethylene glycol, diethylene glycol, triethylene glycol, 1,2-propylene glycol, 1,3-propylene glycol, dipropylene glycol, 1,4-butanediol, 1,3-butanediol, 1,2-butanediol, 2,3-butanediol, 1,5-pentanediol, 1,5-hexanediol, 2,5-hexanediol, 1,6-hexanediol, 1,7-heptanediol, 1,8-octanediol, 1,9-nonanediol, 1,10-decanediol, neopentyl glycol, 3-methyl-1,5-pentanediol, and 2-methyl-1,3-propanediol. The aliphatic polyols may be used in combination with the polyol having an alicyclic structure and the polycarboxylic acid in the esterification reaction of the polyol having an alicyclic structure and the polycarboxylic acid.

An example of the polyol having an alicyclic structure is a polycarbonate polyol having an alicyclic structure. The polycarbonate polyol having an alicyclic structure may be produced by, for example, reacting the above-described low-molecular-weight polyol having an alicyclic structure with dimethyl carbonate, phosgene, or the like.

The number-average molecular weight of the polycarbonate polyol having an alicyclic structure is preferably 800 to 3000 and is more preferably 800 to 2000.

Another example of the polyol having an alicyclic structure is an alicyclic-structure polyether polyol. The polyether polyol having an alicyclic structure can be produced by, for example, addition polymerization of an alkylene oxide such as ethylene oxide or propylene oxide using the above-described low-molecular-weight polyol having an alicyclic structure as an initiator.

Polyisocyanates having an alicyclic structure that can be used for producing the urethane resin constituting the composite resin particles may be the same as the polyisocyanates having an alicyclic structure, which are described above as examples of a compound that can be used for producing the urethane resin (a1).

The hydrophilic groups can be introduced to the urethane resin constituting the composite resin particles using a polyol including hydrophilic groups which is the same as those described above as examples of a compound that can be used for producing the urethane resin (a1).

The vinyl resin constituting the composite resin particles is preferably a vinyl resin having a glass transition temperature of 10° C. to 70° C. in order to further increase adhesion to the particles (b1) included in the ink (b) which serve as plating cores and to thereby further increase ease of depositing a metal on the plating-core pattern. Note that the glass transition temperature of the vinyl resin is generally determined by a calculation based on the composition of vinyl monomers used for producing the vinyl resin.

The weight-average molecular weight of the vinyl resin constituting the composite resin particles is preferably 800 thousand or more and is more preferably one million or more in order to form a coating film that serves as a precursor of the receiving layer, to increase the adhesion of the vinyl resin to the particles (b1) that serve as plating cores, and to reduce the line width of the resulting plating-core pattern.

The upper limit of the weight-average molecular weight of the vinyl resin constituting the composite resin particles is preferably, but not particularly limited to, about ten million or less and is preferably five million or less.

The vinyl resin constituting the composite resin particles may include various functional groups as needed. Examples of the functional groups include crosslinkable functional groups such as an amide group, a hydroxyl group, a glycidyl group, an amino group, a silyl group, an aziridinyl group, an isocyanate group, an oxazoline group, a cyclopentenyl group, an allyl group, a carboxyl group, and an acetoacetyl group.

The vinyl resin constituting the composite resin particles may be the same as the vinyl resin (a2). Specifically, monomers having a polymerizable unsaturated double bond which can be used for producing the vinyl resin (a2) may be the same as the vinyl monomers and, preferably, the (meth) acrylic monomers described above as examples of monomers that can be used for producing the vinyl resin (a2). Functional groups can be introduced to the vinyl resin constituting the composite resin particles by the same method as that in which functional groups are introduced to the vinyl resin (a2).

The composite resin particles can be produced by, for example, reacting the polyisocyanate with the polyol and, as needed, a chain-extending agent and dispersing the resulting compound in water to prepare a water dispersion of a urethane resin; and subsequently polymerizing monomers such as a (meth)acrylic monomer in the water dispersion to produce a vinyl resin.

Specifically, the polyisocyanate is reacted with the polyol in the absence of a solvent, in the presence of an organic solvent, or in the presence of a reactive diluent such as a (meth)acrylic monomer to produce a urethane resin. Subsequently, as needed, some or all of the hydrophilic groups included in the urethane resin are neutralized with a basic compound. As needed, furthermore, the urethane resin is reacted using the chain-extending agent and then dispersed in an aqueous medium to prepare a water dispersion of a urethane resin.

Subsequently, the above-described monomers such as a (meth)acrylic monomer are added to the water dispersion of a urethane resin. In the particles of the urethane resin, radical polymerization of the vinyl monomers is performed to produce a vinyl resin. In the case where the urethane resin is produced in the presence of vinyl monomers, a vinyl resin may be produced by adding a polymerization initiator or the like after the production of the urethane resin to cause radical polymerization of the monomers such as a (meth) acrylic monomer.

In the above-described manner, a resin composition that is an aqueous dispersion of composite resin particles that are urethane resin particles each including a portion or the entirety of a vinyl resin can be produced. This resin composition can be used as the resin included in the composition (a).

In the production of the composite resin particles, common organic solvents and reactive diluents such as methyl ethyl ketone, N-methylpyrrolidone, acetone, and dipropylene glycol dimethyl ether may be used when the high viscosity of the urethane resin deteriorates workability. In particular, monomers that can be used for producing the vinyl resin, such as a (meth)acrylic monomer, are preferably used as the reactive diluent in order to increase production efficiency because this allows a step of removing the solvent to be omitted.

The composition (a) may further include other compounds and resins. In particular, in the case where the particles (b1) that serve as plating cores, which are described below, are protected using an organic compound, the composition (a) preferably further include a compound or a resin that includes functional groups capable of crosslinking with the organic compound in order to increase adhesion between the receiving layer (A) and the plating-core pattern (B).

For example, when the functional groups are isocyanate groups, examples of the compound or resin that may be added to the composition (a) include polyisocyanates such as tolylene diisocyanate, hydrogenated tolylene diisocyanate, triphenylmethane triisocyanate, methylenebis(4-phenylmethane) triisocyanate, isophorone diisocyanate, hexamethylene diisocyanate, and xylylene diisocyanate; nurate-type polyisocyanates produced using these polyisocyanates; and an adduct of any of these compounds and trimethylolpropane or the like. In particular, a nurate of hexamethylene diisocyanate, an adduct of hexamethylene diisocyanate and trimethylolpropane, an adduct of tolylene diisocyanate and trimethylolpropane, and an adduct of xylylene diisocyanate and trimethylolpropane are preferably used.

When the functional groups are isocyanate groups, some or all of the isocyanate groups included in the above-described compounds may be sealed using a blocking agent.

Examples of the blocking agent include phenol, cresol, 2-hydroxypyridine, butyl cellosolve, propylene glycol monomethyl ether, benzyl alcohol, methanol, ethanol, n-butanol, isobutanol, dimethyl malonate, diethyl malonate, methyl acetoacetate, ethyl acetoacetate, acetylacetone, butyl mercaptan, dodecyl mercaptan, acetanilide, acetic acid amide, ε-caprolactam, δ-valerolactam, γ-butyrolactam, succinic acid imide, maleic acid imide, imidazole, 2-methylimidazole, urea, thiourea, ethylene urea, formamide oxime, acetoaldoxime, acetone oxime, methyl ethyl ketone oxime, methyl isobutyl ketoxime, cyclohexanone oxime, diphenylaniline, aniline, carbazole, ethylene imine, and polyethylene imine.

An example of the blocked isocyanate compound is ERASTRON BN-69 (produced by DKS Co. Ltd.), which is a commercially available water-dispersion-type compound.

When the functional groups are epoxy groups, examples of the compound that may be included in the composition (a) include aliphatic polyalcohol polyglycidyl ethers such as ethylene glycol diglycidyl ether, propylene glycol diglycidyl ether, hexamethylene glycol diglycidyl ether, cyclohexanediol diglycidyl ether, glycerin diglycidyl ether, glycerin triglycidyl ether, trimethylolpropane triglycidyl ether, and pentaerythritol tetraglycidyl ether; polyalkylene glycol polyglycidyl ethers such as polyethylene glycol diglycidyl ether, polypropylene glycol diglycidyl ether, and polytetramethylene glycol diglycidyl ether; polyglycidyl amines such as 1,3-bis(N,N'-diglycidylaminoethyl)cyclohexane; polyglycidyl esters of a polycarboxylic acid [e.g., oxalic acid, adipic acid, butanetricarboxylic acid, maleic acid, phthalic acid, terephthalic acid, isophthalic acid, or benzenetricarboxylic acid]; bisphenol-A epoxy resins such as a condensation product of bisphenol A and epichlorohydrin and an ethylene-oxide-adduct of a condensation product of bisphenol A and epichlorohydrin; phenol novolac resins; and vinyl monomers including an epoxy group in the side chain. In particular, polyglycidylamines such as 1,3-bis(N,N'-diglycidylaminoethyl)cyclohexane and aliphatic polyalcohol polyglycidyl ethers such as glycerin diglycidyl ether are preferably used.

When the functional groups are epoxy groups, other examples of the compound that may be included in the composition (a) include silane compounds having glycidyl groups, such as γ-glycidoxypropyltrimethoxysilane, γ-glycidoxypropyltriethoxysilane, γ-glycidoxypropylmethyldimethoxysilane, γ-glycidoxypropylmethyldiethoxysilane, β-(3,4-epoxycyclohexyl)ethyltrimethoxysilane, β-(3,4-epoxycyclohexyl)ethyltriethoxysilane, β-(3,4-epoxycyclohexyl)ethylmethyldiethoxysilane, and γ-glycidoxypropyltriisopropenyloxysilane.

When the functional groups are vinyl groups, examples of the compound that may be included in the composition (a) include polyfunctional vinyl monomers such as (poly)ethylene glycol di(meth)acrylate, (poly)propylene glycol di(meth)acrylate, (poly)butylene glycol di(meth)acrylate, (poly)neopentyl glycol di(meth)acrylate, N,N'-methylenebis(meth)acrylamide, trimethylolpropane triacrylate, pentaerythritol triacrylate, trimethylolpropane EO-added triacrylate, glycerin PO-added triacrylate, trisacryloyloxyethylphosphate, pentaerythritol tetraacrylate, tricyclodecanedimethanol diacrylate, dipentaerythritol hexaacrylate, ditrimethylolpropane tetraacrylate, and pentaerythritol tetraacrylate. As needed, the above-described compounds may be used in the form of a water dispersion with an appropriate surfactant.

When the functional groups are carboxyl groups or carboxylic anhydride groups, examples of the compound that may be included in the composition (a) include dibasic acids such as oxalic acid, tartaric acid, succinic acid, malic acid, maleic acid, fumaric acid, phthalic acid, sebacic acid, dodecanedioic acid, eicosanedioic acid, isodocosadienedioic acid, isodocosanedioic acid, isoeicosanedienedioic acid, butyloctanedioic acid, and dialkoxycarbonylisodocosadienedioic acid and partially neutralized salts of the above-described dibasic acids; tribasic acids such as citric acid and aconitic acid and partially neutralized salts of the above-described tribasic acids; vinyl monomers including carboxylic acid groups, such as acrylic acid, methacrylic acid, β-carboxyethyl (meth)acrylate, 2-(meth)acryloylpropionic acid, crotonic acid, itaconic acid, maleic acid, fumaric acid, an itaconic acid half-ester, and a maleic acid half-ester; and vinyl monomers including carboxylic anhydride groups, such as carboxyl-group-containing vinyl monomers such as maleic anhydride, itaconic anhydride, citraconic anhydride, β-(meth)acryloyloxyethyl hydrogen succinate, citraconic acid, a citraconic acid half-ester, and citraconic anhydride. One or more monomers selected from the above-described compounds may be used.

When the functional groups are N-alkylol groups, examples of the compound that may be included in the composition (a) include mono or polymethylolmelamine to which 1 to 6 moles of formaldehyde is added per mole of the melamine; ethers of (poly)methylolmelamine, such as trimethoxymethylolmelamine, tributoxymethylolmelamine, and hexamethoxymethylolmelamine (degree of etherification is not limited), a condensed product of urea, formaldehyde, and methanol, a condensed product of urea, melamine, formaldehyde, and methanol, poly-N-(alkoxy)methylol (meth)acrylamide, and a formaldehyde-adduct of poly(meth)acrylamide.

As needed, the composition (a) may further include a crosslinking agent (a4), a pH modifier, a coating-film formation assistant, a leveling agent, a thickener, a water-repellent agent, an antifoam agent, a pigment, an organic filler, and an inorganic filler that do not impair the advantageous effect of the present invention.

The crosslinking agent (a4) reacts with the crosslinkable functional groups included in the above-described resin. Examples of the crosslinking agent (a4) include a thermal-crosslinking agent (a4-1) that undergoes a reaction at a relatively low temperature of about 25° C. to about 100° C. to form a crosslinked structure, such as a metal chelate compound, a polyamine compound, an aziridine compound, a metal salt compound, or the above-described isocyanate compound; and a thermal-crosslinking agent (a4-2) that undergoes a reaction at a relatively high temperature of about 100° C. or more to form a crosslinked structure, the thermal-crosslinking agent (a4-2) including one or more compounds selected from the group consisting of a melamine-based compound, the above-described epoxy-based compound, an oxazoline compound, a carbodiimide compound, and the above-described blocked isocyanate compound. In the case where the crosslinking agent (a4) is capable of reacting with the above-described urethane resin (a1), vinyl resin (a2), or composite resin particles, the crosslinking agent (a4) may react with a portion of these components.

In the case where the composition (a) includes the thermal-crosslinking agent (a4-1), a plating-core pattern (B) having durability markedly sufficient to prevent removal of the plating-core particles (b1) from occurring over a prolonged period, even under the influence of heat and external force, can be formed by, for example, coating the surface of a substrate with the composition (a), drying the deposited composition (a) at a relatively low temperature, subsequently depositing an ink (b) including particles (b1) that serve as plating cores on the surface of the resulting coating film by reverse offset printing, and heating the coating film at less than 100° C. to form a crosslinked structure.

Alternatively, in the case where the composition (a) includes the thermal-crosslinking agent (a4-2), a plating-core pattern (B) having durability markedly sufficient to prevent peeling of the particles (b1) that serve as plating cores from occurring over a prolonged period, even under the influence of heat and external force, can be formed by, for example, coating the surface of a substrate with the composition (a), drying the deposited composition (a) at a low temperature of normal temperature (25° C.) to about less than 100° C. to form a coating film in which a crosslinked structure is not formed, subsequently depositing the ink (b) on the surface of the coating film by reverse offset printing, and heating the coating film at, for example, 150° C. or more and preferably 200° C. or more to form a crosslinked structure. Note that, in the case where the substrate is composed of a heat-labile material such as polyethylene terephthalate, heating is preferably performed at about 150° C. or less and preferably at 120° C. or less in order to, for example, prevent the substrate from being deformed. In such a case, the thermal-crosslinking agent (a4-1) is preferably used instead of the thermal-crosslinking agent (a4-2).

Examples of the metal chelate compound that can be used as the thermal-crosslinking agent (a4-1) include acetylacetone coordination compounds and acetoacetic ester coordination compounds of a polyvalent metal such as aluminium, iron, copper, zinc, tin, titanium, nickel, antimony, magnesium, vanadium, chromium, and zirconium. It is preferable to use aluminium acetylacetonate, which is an acetylacetone coordination compound of aluminium.

Examples of the polyamine compound that can be used as the thermal-crosslinking agent (a4-1) include tertiary amines such as triethylenediamine and POLYMENT NK-100PM and NK-200PM (aminated acrylic polymer produced by NIPPON SHOKUBAI CO., LTD.).

Examples of the aziridine compound that can be used as the thermal-crosslinking agent (a4-1) include 2,2-bishydroxymethylbutanol-tris[3-(1-aziridinyl)propionate], 1,6-hexamethylenediethyleneurea, and diphenylmethane-bis-4,4'-N,N'-diethyleneurea.

Examples of the metal salt compound that can be used as the thermal-crosslinking agent (a4-1) include aluminium-containing compounds such as aluminium sulfate, aluminium alum, aluminium sulfite, aluminium thiosulfate, polyaluminium chloride, aluminium nitrate nonahydrate, and aluminium chloride hexahydrate; and water-soluble metal salts such as titanium tetrachloride, tetraisopropyl titanate, titanium acetylacetonate, and titanium lactate.

Examples of the melamine compound that can be used as the thermal-crosslinking agent (a4-2) include hexamethoxymethylmelamine, hexaethoxymethylmelamine, hexapropoxymethylmelamine, hexabutoxymethylmelamine, hexapentyloxymethylmelamine, hexahexyleloxymethylmelamine, and a mix-etherified melamine including any two of the above-described melamines. In particular, it is preferable to use trimethoxymethylmelamine or hexamethoxymethylmelamine. Examples of commercially available products of these amines include BECKAMINE M-3, APM, and J-101 (produced by DIC Corporation). The above-described melamine compounds induce a self-crosslinking reaction to form a crosslinked structure.

In the case where the melamine compound is used as the thermal-crosslinking agent (a4-2), a catalyst such as an organic amine salt may be used in order to promote the self-crosslinking reaction. Examples of the catalyst include, as commercially available products, CATALYST ACX and 376. The amount of the catalyst used is preferably about 0.01% to 10% by mass of the total amount of the melamine compound used.

Examples of the oxazoline compound that can be used as the thermal-crosslinking agent (a4-2) include 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), bis-(2-oxazolinylcyclohexane)sulfide, and bis-(2-oxazolinylnorbornane)sulfide.

The oxazoline compound may be an oxazoline-group-containing polymer produced by, for example, polymerizing any of the following addition-polymerizable oxazolines with, as needed, other monomers.

Examples of the addition-polymerizable oxazolines include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-methyl-2-oxazoline, and 2-isopropenyl-5-ethyl-2-oxazoline. These oxazolines may be used alone or in combination of two or more. In particular, 2-isopropenyl-2-oxazoline is preferably used because it is industrially, readily available.

Examples of the carbodiimide compound that can be used as the thermal-crosslinking agent (a4-2) include poly[phenylenebis(dimethylmethylene)carbodiimide], poly(methyl-1,3-phenylenecarbodiimide), as commercially available products, CARBODILITE V-01, V-02, V-03, V-04, V-05, and V-06 (produced by Nisshinbo Holdings Inc.) and UCARLINK XL-29SE and XL-29MP (produced by Union Carbide Corporation).

Generally, the amount of the crosslinking agent (a4) used is preferably, but varies depending on the type thereof, 0.01% to 60% by mass, is more preferably 0.1% to 10% by mass, and is preferably 0.1% to 5% by mass relative to 100 parts by mass of the total mass of the resins included in the composition (a) in order to form a plating-core pattern (B) having good adhesion and high durability as described above.

In general, water-soluble resins such as polyvinyl alcohol and polyvinylpyrrolidone are used for increasing ease of applying an aqueous coating solution. However, the resin layer designed for aqueous coating solutions does not have sufficient adaptability to solvent-based coating solutions, which usually results in occurrence of uncoated spots and unevenness and deteriorates the ease of applying an aqueous coating solution.

The resin composition (a) used in the present invention is compatible with an aqueous coating solution and solvent-based coating solution, even when the resin composition (a) does not include the water-soluble resin such as polyvinyl alcohol or includes the minimum amount of the water-soluble resin. Thus, a receiving layer (A) having good suitability for coating can be formed using the resin composition (a) in any case where the ink (b) including the particles (b1) that serve as plating cores, which is described below, includes water, a mixed solvent of water and a water-soluble organic solvent, or an organic solvent that does not contain water.

Therefore, when the resin composition (a) includes the water-soluble resin, the amount of the water-soluble resin used is preferably 15% by mass or less, is more preferably 0% to 10% by mass, is further preferably 0% to 5% by mass, and is particularly preferably 0% to 0.5% by mass of the total amount of the above-described urethane resin (a1) and the vinyl resin (a2).

In general, a large amount of filler such as silica, alumina, or starch is used for forming a microporous-type receiving layer. A small amount of filler may be used for forming a swelling-type receiving layer in order to increase the blocking resistance of the receiving layer.

Even when the resin composition (a) used in the present invention does not include a filler such as silica or includes the minimum amount of filler, a receiving layer having sufficient suitability for coating to prevent uncoated spots and unevenness from occurring can be formed using the resin composition (a) in any case where the ink (b) includes water, a mixed solvent of water and a water-soluble organic solvent, or an organic solvent that does not contain water.

Therefore, when the resin composition (a) includes a filler, the amount of the filler used is preferably 15% by mass or less, is more preferably 0% to 10% by mass, and is further preferably 0% to 0.5% by mass of the total amount of the above-described urethane resin (a1) and the vinyl resin (a2) in order to form a receiving layer (A) having sufficient suitability for coating. In particular, in order to prevent adhesion to a flexible substrate such as a film from being degraded, the amount of the filler used is also preferably within the above-described range.

The surface of the substrate may be coated with the resin composition (a) by any method that enables the receiving layer (A) to be appropriately formed. The method is not particularly limited and may be selected appropriately from various printing and coating methods depending on the shape, size, and stiffness of the substrate used. Specific examples of the method include a gravure method, an offset method, a relief printing plate method, a reverse offset printing method, a screen method, a micro-contact method, a reverse method, an air doctor coater method, a blade coater method, an air knife coater method, a squeeze coater method, an impregnation coater method, a transfer roll coater method, a kiss coater method, a cast coater method, a spray coater method, an ink-jet method, a die method, a spin coater method, a bar coater method, and a dip coater method.

After the resin composition (a) is applied to the substrate, the resulting coating film may be dried by any method, and the method is not particularly limited. In the case where the substrate is a cut film, cut sheet, or cut plate, the coating film may be air-dried in the place where coating was performed or may be dried in a drying machine such as a fan drying machine or an automatic oven. In the case where the substrate is a rolled sheet, the coating film may be dried by continuously feeding the rolled sheet through a non-heated or heated space located subsequent to the printing and coating step.

The drying temperature may be set to any temperature at which the medium (a3) constituting the resin composition (a) is volatile and which does not adversely affect the substrate that serves as a support. Specifically, in the case where the thermal-crosslinking agent (a4-1) is used, the drying temperature is preferably about 25° C. to less than about 100° C. In the case where the thermal-crosslinking agent (a4-2) is used, the drying temperature is preferably about 100° C. or more and is more preferably about 120° C. to about 300° C. In the case where the thermal-crosslinking agent (a4-2) is used and a crosslinked structure is to be formed after printing of the ink (b), the drying temperature is preferably controlled to be relatively low, that is, normal temperature (25° C.) to about 100° C., so that a crosslinked structure is not formed prior to printing of the ink (b).

The thickness of the receiving layer (A), which is formed on the surface of the substrate, may be controlled depending on the type and thickness of the substrate used. Considering the amount of the solvent included in the ink (b) described below, and, in order not to deteriorate the properties of the substrate, the thickness of the receiving layer (A) is desirably 300 µm or less and is more preferably 20 µm or less when measured after drying. In the case where the substrate is a film-like substrate having a thickness of 50 µm or less, the thickness of the receiving layer (A) is preferably 1 µm or less and is more preferably 10 to 500 nm.

The receiving layer (A) formed in the above-described manner is a swelling-type receiving layer, which is dissolved in a solvent included in the ink (b) described below to a certain extent and thereby absorbs the solvent. Thus, the particles (b1) included in the ink (b), which serve as plating cores, can be fixed to the swelling-type receiving layer with high accuracy, which contributes to formation of a smear-resistant plating-core pattern (B). Using the above-described receiving layer (A) enables a resin layer having higher transparency to be formed than the porous-type receiving layer known in the related art.

<Ink (b) Including Particles (b1) Serving as Plating Cores>

The ink (b) including the particles (b1) serving as plating cores (hereinafter, referred to as simply "plating-core ink") used in the present invention is an ink to be transferred to the receiving layer (A) formed on the substrate as described above by reverse offset printing described below.

The diameter of the particles (b1) that serve as plating cores is preferably 2 to 150 nm and is further preferably 5 to 100 nm in terms of mean volume diameter (Mv). Using the above-described particles having a diameter of the order of nanometers enhances transferring-printing properties presumably due to improvement of the interparticle cohesion of the ink (b) in a semi-arid condition. In addition, reducing the diameter of the particles enables a fine pattern to be formed.

Examples of particles that can be used as the particles (b1) that serve as plating cores include particles of a metal such as gold (Au), silver (Ag), copper (Cu), nickel (Ni), zinc (Zn), aluminium (Al), iron (Fe), platinum (Pt), palladium (Pd), tin (Sn), chromium (Cr), or lead (Pb); particles of an alloy of the above-described metals, such as an palladium alloy (Ag/Pd); core-shell particles including the above-described metals; and particles of a conductive metal oxide such as zinc oxide (ZnO), indium tin oxide (ITO), or indium oxide-zinc oxide (IZO). In addition, the following particles may be used as needed: particles of a metal complex such as the silver salt of a carboxylic acid, carboxylic acid or the silver salt of an aminocarboxylic acid; particles of a thermally decomposable compound such as silver oxide ($Ag_2O$), which decomposes when being fired at 200° C. or less and changes into a conductive metal; and particles of a conductive polymer such as polyethylenedioxythiophene/polystyrene sulfonate (PEDOT/PSS).

Among the above-described particles, particles of silver and/or copper, that is, nanoparticles of silver, nanoparticles of copper, nanoparticles of an alloy of silver and copper, and core-shell particles having a core including silver and/or copper, are preferably used in order to increase ease of depositing a metal by plating.

Since the particles (b1) that serve as plating cores preferably have a size of the order of nanometers, it is preferable to stabilize the particles (b1) by protecting the particles (b1) using an organic compound.

Any compound used as a dispersant or a surfactant can be used as the organic compound that serves as an agent used for protecting the particles (b1) that serve as plating cores. Examples of such a compound include amine polymer dispersants such as polyethyleneimine and polyvinylpyrrolidone; hydrocarbon polymer dispersants including a carboxylic acid group in the molecules, such as polyacrylic acid and carboxymethyl cellulose; and polymer dispersants including a polar group, such as polyethylene glycol, alkylthiol, polyvinyl alcohol, styrene-maleic acid copolymer, olefin-maleic acid copolymer, and a copolymer including a polyethyleneimine-part and a polyethylene-oxide-part per molecule. In general, the above-described organic compounds are used in mixture or in the form of a copolymer. When importance is placed on adhesion to the above-described receiving layer (A), an organic compound including a functional group that reacts with a functional group included in the urethane resin (a1), the vinyl resin (a2), or the composite resin particles of the urethane resin (a1) and the vinyl resin (a2) included in the above-described receiving layer (A) is preferably used. In order to enhance the properties of the ink (b), such as preservation stability and adhesion to the receiving layer (A), in a balanced manner, an organic compound including a basic nitrogen atom, such as an imino group, a primary amino group, or a secondary amino group, is preferably used.

The plating-core ink may include any binder resin. Specific examples of the binder resin include natural rubber; olefin resins; polyethers such as polyethylene oxide and polypropylene oxide; unsaturated polyester resins; acrylic resins; phenolic resins; melamine resins; benzoguanamine resins; epoxy resins; urethane resins; vinyl polyester resins; petroleum resins; rosin resins; silicone resins; vinyl resins such as polyvinyl alcohol, vinyl chloride, vinyl acetate, and vinyl chloride-vinyl acetate copolymer; cellulose resins; and natural polysaccharides.

The amount of the organic compound used as an agent for protecting the particles (b1) that serve as plating cores and the amount of the binder optionally used are preferably 15% by mass or less, is more preferably 10% by mass or less, and is further preferably 5% by mass or less of the total mass of the particles (b1) that serve as plating cores which are included in the plating-core ink in order to increase the ease of depositing a metal on the plating-core pattern by electroless plating.

The plating-core ink preferably include a surface-energy modifier in order to enhance printability by reverse offset printing. A fluorine-based surface-energy modifier and/or a silicone-based surface-energy modifier can be suitably used as the surface-energy modifier. Examples of the fluorine-based surface-energy modifier include MEGAFACE series produced by DIC Corporation and Novec series produced by 3M Company. In particular, a fluorine-based surface-energy modifier including fluorinated (meth)acrylate polymer produced by DIC Corporation is suitably used. Examples of the silicone-based surface-energy modifier that can be suitably used include BYK series produced by BYK Japan KK. It is further preferable to use the fluorine-based surface-energy modifier and the water-compatible silicone-based surface-energy modifier in combination. Using the two surface-energy modifiers in combination reduces rejecting of ink on the releasing surface of a blanket while reducing the amount of the surface-energy modifiers added to the ink. The mixing ratio of the fluorine-based surface-energy modifier to the silicone-based surface-energy modifier is not particularly limited. However, when the mixing ratio (fluorine-based surface-energy modifier/silicone-based surface-energy modifier) is 1/1 to 1/0.1, an advantageous effect may be produced.

The amount of the above-described surface-energy modifiers used is 0.05% to 5.0% by mass and is preferably 0.1% to 0.5% by mass of the total amount of the ink (b) in order to prevent rejecting of ink on the blanket, to form a uniform coating film, and to increase ease of depositing a metal by plating on the ink film after firing.

It is preferable to add the above-described surface-energy modifiers to the plating-core ink so that the surface energy of the plating-core ink at 25° C. is set to 25 mN/m or less. This enhances the smoothness of an ink film deposited on the liquid-repellent releasing surface of the blanket and enables a more uniform coating film to be formed.

The releasing surface of the blanket may be subjected to an ozone UV treatment or an ozone plasma treatment in order to prevent rejecting of ink on the releasing surface.

The plating-core ink used in the present invention may include a releasing agent as needed in order to enhance pattern formability and ease of transferring a pattern. Examples of the releasing agent that can be suitably used include silicone oils such as KF96 series (trade name) produced by Shin-Etsu Chemical Co., Ltd. and SH28 (trade name) produced by Dow Corning Toray Co., Ltd. In particular, low-molecular-weight silicones (molecular weight: about 148 to about 2220), that is, silicone dimer to 30-mer, are preferably used because they hardly deteriorate ease of ink patterning and ease of depositing a metal by plating on the coating film that has been fired. Examples of such silicone oils include KF96 series produced by Shin-Etsu Chemical Co., Ltd., which are silicones having a dynamic viscosity of 20 mm$^2$/s or less at 25° C. The content of the releasing agent in the ink (b) is 0.05% to 5.0% by mass and is preferably 0.1% to 1.0% by mass. Addition of the releasing agent prevents the releasability of the ink from the blanket from being degraded, even when the wettability of the ink to the blanket is enhanced by using a solvent or by controlling surface energy. This improves ease of transferring a pattern by reverse offset printing.

In order to further stabilize the dispersibility of the particles (b1) that serve as plating cores and to promote low-temperature firing, the plating-core ink used in the present invention may include the following amine compounds, inorganic acids, and organic acid as needed: for example, alkylamines such as diethylamine, triethylamine, and diisopropylamine; ethanolamines such as monoethanolamine, diethanolamine, and triethanolamine; ammonium carbonates; ammonium carbamates; formic acid; acetic acid; propionic acid; nitric acid; phosphoric acid; hydrogen peroxide; and nitric acid amine.

The dispersion solvent that can be used for producing the plating-core ink is not particularly limited, and any solvent in which the particles (b1) used can be stably dispersed alone or in mixture may be used. Examples of such a solvent include water; alcohols such as methanol, ethanol, butyl alcohol, isopropyl alcohol, methoxy butanol, and tertiary-butanol; polyalcohols such as ethylene glycol, propylene glycol, diethylene glycol, and glycerin; esters such as ethyl acetate, methyl acetate, propyl acetate, isopropyl acetate, isobutyl acetate, methoxybutyl acetate, and ethyl lactate; carbonate esters such as dimethyl carbonate, and propylene carbonate; ethers such as isopropyl ether, dioxane, methyl tertiary-butyl ether, and tetrahydrofuran; ketones such as acetone, methyl ethyl ketone, methyl butyl ketone, methyl isobutyl ketone, cyclohexanone, and diacetone alcohol; glycol ethers such as methyl cellosolve, cellosolve, butyl cellosolve, diethylene glycol monomethyl ether, propylene glycol n-propyl ether, dipropylene glycol monomethyl ether, propylene glycol monomethyl ether, and propylene glycol monoethyl ether; glycol acetates such as ethylene glycol monomethyl ether acetate and propylene glycol monomethyl ether acetate; glycol diethers such as methyl monoglyme, methyl diglyme, methyl triglyme, and ethyl monoglyme; alicyclic hydrocarbons such as cyclohexanone, methylcyclohexanone, cyclohexanol, and methylcyclohexanol; aliphatic hydrocarbons such as normal hexane; aromatic hydrocarbons such as toluene and xylene; aromatic chlorohydrocarbons such as chlorobenzene and ortho-dichlorobenzene; and aliphatic chlorohydrocarbons such as dichloromethane, chloroform, carbon tetrachloride, dichloroethylene, and trichloroethylene. The above-described solvents may be used alone or in mixture as needed. In particular, a mixed solvent including an alcohol solvent as a main component is preferably used.

The above-described solvent may be used in mixture with a solvent that causes the releasing surface of the blanket to be swelled in order to prevent rejecting of the ink (b) and to form a defect-free and uniform ink film. It is initially required in reverse offset printing to form a defect-free, uniform, thin ink film on a smooth, liquid-repellent releasing surface of a blanket. If rejecting of ink occurs on the releasing surface, pattern defect may occur. The amount of the solvent that causes the releasing surface of the blanket to be swelled is preferably, by mass, 5% to 70% and is more preferably 20% to 50% of the total amount of the solvent. The liquid that causes a blanket to be swelled is a solvent such that, in the case where the releasing surface of the blanket is composed of, for example, silicone rubber, the weight of the silicone rubber increases by 10% or more and further preferably by 20% or more while the silicone rubber is immersed in the solvent for 15 minutes. Examples of such a solvent that can be suitably used include dimethyl carbonate, diethyl carbonate, isopropyl acetate, n-propyl acetate, butyl acetate, methoxybutyl acetate, dioxane, isopropyl alcohol, methyl monoglyme, ethyl monoglyme, methyl diglyme, ethyl diglyme, dipropylene glycol dimethyl ether, propylene glycol n-butyl ether, propylene glycol n-propyl ether, and propylene glycol monomethyl ether acetate.

<Formation of Plating-Core Pattern (B) by Reverse Offset Printing>

Fundamental steps for forming the plating-core pattern by reverse offset printing are described below with reference to FIG. 1.

(Inking Step) FIG. 1(a)

The releasing surface of a blanket (reference numeral 2 in FIG. 1) is coated with a plating-core ink to form a uniform ink film (reference numeral 1 in FIG. 1). The ink film is dried adequately until it is brought to a state in which a pattern can be formed in the film using a relief plate. At this time, it is preferable to control the drying conditions by controlling the ambient temperature and humidity. Dry air may be blown over the surface of the ink film in order to shorten the drying time. Insufficient drying of the ink may result in spreading and curving of the printed lines and changes in dimensions (shrinking) and, as a result, the shape of the relief plate cannot be replicated accurately. On the other hand, excessive drying of the ink deteriorates the linearity of the printed lines and, at worst, causes the ink to strongly adhere to the blanket, which results in difficulty in removing the unwanted pattern using the relief plate. In such a case, naturally, the printed-line pattern cannot be transferred from the blanket to an object to which a pattern is transferred in the subsequent step. A method for forming the ink film on the blanket is not limited, and slit coating, bar coating, spin coating, or the like may be employed for forming an ink film having a predetermined thickness. The thickness of a wet film formed by depositing the ink is preferably controlled to be 0.1 to 1 μm in order to achieve adequate fine-pattern formability and an adequate drying property in the subsequent steps. The releasing surface of the blanket is generally composed of a liquid-repellent rubber. Examples of the liquid-repellent rubber include silicone elastomers such as a vinyl silicone rubber and a fluorinated silicone rubber; various fluororesin elastomers; an ethylene propylene rubber; and olefin elastomers. In particular, silicone elastomers and fluorine-based elastomers, which have a good liquid-repelling property, are preferably used in order to enhance the releasability of the pattern. In particular, silicone elastomers are particularly suitably used as a rubber for forming the releasing surface of the blanket because they have an adequate liquid-repelling property, adequate resistance to solvents, and an adequate solvent-swelling property. The structure of the blanket is not particularly limited. The blanket is preferably lined with sponge such as urethane foam in order to make the pressure applied to the printing surface uniform.

(Step of Forming Pattern Using Relief Plate) FIG. 1(b)

A relief printing plate (reference numeral 3 in FIG. 1) having a negative pattern of the desired plating-core pattern is lightly pressed against the ink film and subsequently separated from the ink film. Thus, portions of the ink film which are brought into contact with protruding portions of the relief plate are removed in a specific pattern. As a result, a plating-core pattern is formed in the releasing surface of the blanket. It is essential to bring the relief plate into contact with the ink-film surface of the blanket as lightly as possible. An excessively high contact pressure may cause the rubber constituting the releasing surface of the blanket to excessively deform, which in turn causes pattern defects (roof collapse) to occur due to the contact of the ink film with the recessed portions of the relief plate and reduces the accuracy of the position of the pattern due to the deformation of the blanket.

The material of the relief plate is not particularly limited, and any material that enables the ink film to be removed from the releasing surface of the blanket may be used. Examples of such a material include metals such as glass, silicon, and stainless steel; and resins (photoresist materials). A method for processing the above-described materials into the relief printing plate is also not limited, and any method that best fits the type of material, pattern accuracy, the depth of the relief printing plate, and the like may be selected. For example, in the case where the material of the relief plate is glass or silicon, the processing method may be wet etching, dry etching, or the like. In the case where the material of the relief plate is a metal, wet etching, electroforming, sand blasting, and the like may be employed. In the case where the material of the relief plate is a resin, processing methods such as photolithoetching, laser drawing, and convergent-ion-beam drawing are suitably employed.

(Transfer Step) FIG. 1(c)

The plating-core pattern formed on the releasing surface of the blanket is lightly pressed against an object to which a pattern is transferred (reference numeral 4 in FIG. 1), which is a substrate on which the above-described receiving layer (A) is formed, to transfer the entire pattern.

The transferred plating-core pattern is dried and/or sintered by a common ink-firing method. Examples of the common ink-heating-firing method include hot-air-oven firing, infrared radiation firing, light firing using, for example, a xenon lamp, plasma firing, and electromagnetic wave firing.

In the present invention, a mechanism for transferring a pattern by reverse offset printing is not particularly limited, and the following methods may be employed: a method in which a relief plate and a blanket are brought into contact with each other by a parallel flat-plate method; a method in which a blanket wound around a roll is brought into contact with a flat relief plate by rolling the roll on the relief plate; a method in which, conversely, a relief plate formed on a roll is brought into contact with a flat blanket by rolling the roll on the blanket; and a method in which a blanket and a relief plate each formed on a different roll are brought into contact with each other.

<Metal Deposition Process: Electroless Plating>

In the present invention, a metal pattern is formed by depositing a metal on the surface of the plating-core pattern (B), which is formed by the above-described method, by electroless plating.

In an electroless plating process, for example, when the above-described particles (b1) constituting the plating-core pattern, which serve as plating core, are brought into contact with an electroless plating solution, a metal included in the electroless plating solution, such as copper, is precipitated and forms an electroless-plating layer (coating film) that is a metal-coating film.

The electroless plating solution includes, for example, a conductive material that is a metal such as copper, nickel, chromium, cobalt, or tin; a reducing agent; and a solvent such as an aqueous medium or an organic solvent.

Examples of the reducing agent include dimethylamino borane, hypophosphorous acid, sodium hypophosphite, dimethylamine borane, hydrazine, formaldehyde, sodium borohydride, and phenols.

The electroless plating solution may include a complexing agent as needed. Examples of the complexing agent include organic acids such as monocarboxylic acids such as acetic acid and formic acid, dicarboxylic acids such as malonic acid, succinic acid, adipic acid, maleic acid, and fumaric acid, hydroxycarboxylic acids such as malic acid, lactic acid, glycolic acid, gluconic acid, and citric acid, amino acids such as glycine, alanine, imino diacetic acid, arginine, aspartic acid, and glutamic acid, and aminopolycarboxylic acids such as imino diacetic acid, nitrilotriacetic acid, ethylenediaminediacetic acid, ethylenediaminetetraacetic acid, and diethylenetriaminepentaacetic acid; soluble salts of the above-described organic acids (e.g., sodium salts, potassium salts, and ammonium salts); and amines such as ethylenediamine, diethylenetriamine, and triethylenetetramine.

When the electroless plating solution is used, the temperature of the electroless plating solution is preferably about 20° C. to 98° C.

The metal pattern formed by the above-described method reduces the occurrence of delamination and the like and has markedly high durability. Thus, the metal pattern is suitably used in applications that require high durability, such as interlayer electrodes for multilayer ceramic capacitors (MLCC) and microbumps used for joining of chip-on films (COF).

EXAMPLES

The present invention is described specifically below with reference to Examples. In Examples, all "%" denotes "% by mass" unless otherwise specified.

<Synthesis of Dispersion of Silver Nanoparticles Protected with Organic Compound>

[Synthesis of Tosylated Polyethylene Glycol]

In 150 ml of chloroform, 150 g [30 mmol] of one-terminal-methoxylated polyethylene glycol (hereinafter, abbreviated as "PEGM") [number-average molecular weight (Mn): 5000] (produced by Aldrich Corporation) and 24 g (300 mmol) of pyridine were mixed to prepare a solution. Another solution was prepared by uniformly mixing 29 g (150 mmol) of tosyl chloride and 30 ml of chloroform.

The toluene solution of tosyl chloride was added dropwise into the mixed solution of PEGM and pyridine under stirring at 20° C. After the dropwise addition was completed, the reaction was carried out at 40° C. for 2 hours. After the reaction was completed, the resulting reaction solution was diluted with 150 ml of chloroform, washed with 250 ml (340 mmol) of a 5% aqueous HCl solution, and subsequently washed with saturated saline and water. The resulting chloroform solution was dried over sodium sulfate. Subsequently, the solvent was distilled away using an evaporator, and further drying was performed. The yield was 100%. The assignment of peaks observed by $^1$H-NMR spectroscopy (2.4 ppm: the methyl group of a tosyl group, 3.3 ppm: the methyl group at the terminal of PEGM, 3.6 ppm: the EG chain of PEG, and 7.3 to 7.8 ppm: the benzene ring of a tosyl group) confirmed that the resulting product was tosylated polyethylene glycol.

[Synthesis of Compound Having PEG/Branched PEI Structure]

In 180 ml of dimethylacetamide (hereinafter, abbreviated as "DMA"), 23.2 g (4.5 mmol) of tosylated polyethylene glycol prepared above in 1-1 and 15.0 g (1.5 mmol) of branched polyethyleneimine ("EPOMIN SP200", produced by NIPPON SHOKUBAI CO., LTD.) were dissolved. To the resulting solution, 0.12 g of potassium carbonate was added. A reaction was carried out at 100° C. for 6 hours in a nitrogen atmosphere. After the reaction was completed, a solid residue was removed from the reaction solution. A mixed solvent of 150 ml of ethyl acetate and 450 ml of hexane was added to the reaction solution to form a precipitate. The precipitate was dissolved in 100 ml of chloroform. To the resulting solution, a mixed solvent of 150 ml of ethyl acetate and 450 ml of hexane was again added to perform reprecipitation. The resulting precipitate was filtered and then dried under reduced pressure. The assignment of peaks observed by $^1$H-NMR spectroscopy (2.3 to 2.7 ppm: ethylene of branched PEI, 3.3 ppm: the methyl group at the terminal of PEG, and 3.6 ppm: the EG chain of PEG) confirmed that the resulting product was a compound having a PEG/branched PEI structure. The yield was 99%.

To 138.8 g of an aqueous solution containing 0.592 g of the compound prepared above, 10.0 g of silver oxide was added, and the resulting mixture was stirred at 25° C. for 30 minutes. To the mixture, 46.0 g of dimethylethanolamine was gradually added under stirring. Although the reaction solution turned dark red and slightly generated heat after the addition of dimethylethanolamine, the reaction solution was left standing and stirred at 25° C. for 30 minutes. Subsequently, 15.2 g of a 10%-aqueous ascorbic acid solution was gradually added to the reaction solution under stirring. After the addition of the aqueous ascorbic acid solution, the reaction solution was further stirred for another 20 hours while maintaining the same temperature to form a dark red dispersion.

To the reacted dispersion prepared above, a mixed solvent of 200 ml of isopropyl alcohol and 200 ml of hexane was added. The resulting mixture was stirred for 2 minutes, and centrifugal concentration of the mixture was performed at 3000 rpm for 5 minutes. After the resulting supernatant was removed, the resulting precipitate was added to a mixed solvent of 50 ml of isopropyl alcohol and 50 ml of hexane. The resulting mixture was stirred for 2 minutes, and centrifugal concentration of the mixture was performed at 3000 rpm for 5 minutes. After the resulting supernatant was removed, 20 g of water was further added to the resulting precipitate, and the resulting mixture was stirred for 2 minutes. Then, the organic solvent of the mixture was removed under reduced pressure to prepare a paste of silver nanoparticles. Water was added to the paste to form a water dispersion having a solid content of about 70%.

Measurement of the visible absorption spectrum using a diluent of a sample of the dispersion prepared above confirmed that silver nanoparticles were produced since the peak of plasma absorption spectrum occurred at 400 nm. An observation of the silver nanoparticles using a TEM confirmed that the silver nanoparticles were spherical in shape (average particle diameter: 17.5 nm). The silver content of the solid measured by TG-DTA was 97.2%.

<Preparation of Plating-Core Ink (b-1) for Reverse Printing>

An ink (b-1) for reverse offset printing including silver nanoparticles, which were the particles that served as plating cores, was prepared by mixing 24% of the water dispersion prepared above, which had a solid content of about 70%, 0.5% of F-555 (fluorine-based surface-energy modifier prepared by DIC Corporation), 0.1% of BYK333 (silicone-based surface-energy modifier, produced by BYK), 74.6% of ethanol, and 0.8% of glycerin.

<Preparation of Plating-Core Ink (b') for IJ Printing>

A plating-core ink (b') for IJ printing was prepared by mixing 43% of the water dispersion prepared above, which had a solid content of about 70% and included silver nanoparticles protected with an organic compound, 0.1% of KF-351A (silicone-based surface-energy modifier, produced by Shin-Etsu Chemical Co., Ltd.), 18% of ethanol, 27% of 1,3-butylene glycol, 10% of glycerin, and 2% of distilled water.

<Preparation of Plating-Core Ink (b-2) for Reverse Printing>

An ink (b-2) for reverse offset printing including silver nanoparticles, which were the particles that served as plating cores, was prepared by mixing 48% of a nano silver dispersion "FINESPHERE SVE102" (solid content: about 30%) produced by Nippon Paint Co., Ltd., 1.1% of MEGAFACE F-555 (fluorine-based surface-energy modifier, produced by DIC Corporation), 0.2% of KF96-1cs (silicone-based releasing agent, produced by Shin-Etsu Chemical Co., Ltd.), 30.2% of ethanol, 20% of isopropyl acetate, and 0.5% of propylene carbonate.

Synthesis Example 1

Synthesis of Urethane Resin (a1-1)

In a nitrogen-purged container equipped with a thermometer, a nitrogen-gas introduction tube, and a stirrer, 100 parts by mass of polyester polyol (polyester polyol produced by reacting 1,4-cyclohexanedimethanol with neopentyl glycol and adipic acid, hydroxyl group equivalent: 1000 g/eq.), 17.4 parts by mass of 2,2-dimethylolpropionic acid, 21.7 parts by mass of 1,4-cyclohexanedimethanol, and 106.2 parts by mass of dicyclohexylmethane diisocyanate were mixed together in 178 parts by mass of methyl ethyl ketone to undergo a reaction. Thus, an organic solvent solution of a urethane prepolymer including the terminal isocyanate groups was prepared. In the organic solvent solution of the urethane prepolymer, 44.7 parts by mass of pentaerythritol triacrylate was mixed to react the urethane prepolymer with pentaerythritol triacrylate. Thus, an organic solvent solution of a urethane resin including vinyl groups and carboxyl groups was prepared. To the organic solvent solution of a urethane resin, 14.8 parts by mass of triethylamine was added to neutralize some or all of the carboxyl groups of the urethane resin, and 380 parts by mass of water was further added thereto. The resulting mixture was vigorously stirred to form a water dispersion of a urethane resin. To the water dispersion, 8.8 parts by mass of a 25%-by-mass aqueous ethylenediamine solution was added, and the resulting mixture was stirred to perform chain elongation of the particulate polyurethane resin. Subsequently, aging and removal of the solvent were performed. Thus, a water dispersion of a urethane resin (a1-1) having a solid content concentration of 30% by mass was prepared. The urethane resin (a1-1) had an acid value of 30 and a weight-average molecular weight of 82000.

Synthesis Example 2

Synthesis of Urethane Resin (a1-2)

In a nitrogen-purged container equipped with a thermometer, a nitrogen-gas introduction tube, and a stirrer, 100 parts by mass of polyester polyol (polyester polyol produced by reacting 1,4-cyclohexanedimethanol with neopentyl glycol and adipic acid, hydroxyl group equivalent: 1000 g/eq.), 17.4 parts by mass of 2,2-dimethylolpropionic acid, 21.7 parts by mass of 1,4-cyclohexanedimethanol, and 106.2 parts by mass of dicyclohexylmethane diisocyanate were mixed together in 178 parts by mass of methyl ethyl ketone to undergo a reaction. Thus, an organic solvent solution of a urethane polymer including an isocyanate group at the terminal of the molecule was prepared. To the organic solvent solution of a urethane prepolymer, 13.3 parts by mass of triethylamine was added to neutralize some or all of the carboxyl groups of the urethane resin, and 277 parts by mass of water was further added thereto. The resulting mixture was vigorously stirred to form a water dispersion of a urethane resin including carboxyl groups. To the water dispersion, 8 parts by mass of a 25%-by-mass aqueous ethylenediamine solution was added, and the resulting mixture was stirred to perform chain elongation of the particulate polyurethane resin. Subsequently, aging and removal of the solvent were performed. Thus, a water dispersion of a urethane resin (a1-2) having a solid content concentration of 30% by mass was prepared. The urethane resin (a1-2) had an acid value of 30 and a weight-average molecular weight of 55000.

Synthesis Example 3

Synthesis of Urethane Resin (a1-3)

In a nitrogen-purged container equipped with a thermometer, a nitrogen-gas introduction tube, and a stirrer, 100 parts by mass of a polyether polyol (hydroxyl group equivalent: 1000 g/eq.) that was a propylene-oxide-adduct of bisphenol A, 21.6 parts by mass of 1,4-cyclohexanedimethanol, and 66.8 parts by mass of dicyclohexylmethane diisocyanate were mixed together in 178 parts by mass of methyl ethyl ketone to undergo a reaction. Thus, an organic solvent solution of a urethane prepolymer including the terminal isocyanate group was prepared. In the organic solvent solution of the urethane prepolymer, 9.6 parts by mass of methyl ethyl ketone oxime was mixed to react the urethane prepolymer with methyl ethyl ketone oxime. Thus, an organic solvent solution of a urethane resin (a1-3) including blocked isocyanate groups was prepared.

Synthesis Example 4

Synthesis of Vinyl Resin (a2-1)

In a reaction container equipped with a stirrer, a reflux cooling tube, a nitrogen introduction tube, a thermometer, and a dropping funnel, 115 parts by mass of deionized water and 4 parts by mass of LATEMUL E-118B (produced by Kao Corporation, active ingredient: 25% by mass) were charged. The temperature was increased to 75° C. while nitrogen was blown into the reaction container. Under stirring, to the reaction container, a vinyl monomer mixture of 48 parts by mass of methyl methacrylate, 45 parts by mass of n-butyl acrylate, 2 parts by mass of methacrylic acid, and 5 parts by mass of 2-hydroxyethyl methacrylate; and a portion (5 parts by mass) of a monomer pre-emulsion prepared by mixing 4 parts by mass of AQUALON KH-1025 (produced by DKS Co. Ltd., active ingredient: 25% by mass) with 15 parts by mass of deionized water were added. Subsequently, 0.1 parts by mass of potassium persulfate was further added thereto. While the temperature inside the reaction container was kept at 75° C., polymerization was performed for 60 minutes. Then, while the temperature inside the reaction container was kept at 75° C., the remaining portion of the monomer pre-emulsion (114 parts by mass) and 30 parts by mass of an aqueous potassium persulfate solution (active ingredient: 1.0% by mass) were each added dropwise to the reaction container using a different dropping funnel over 180 minutes. After the dropwise addition was completed, stirring was performed for 60 minutes at the same temperature. Then, the temperature inside the reaction container was reduced to 40° C., and ammonia water (active ingredient: 10% by mass) was added to the reaction container so that the pH of the resulting water dispersion in the reaction container became 8.5. Subsequently, deionized water was added to the reaction container so that the nonvolatile content of the water dispersion became 20% by mass. The water dispersion was filtered through a 200-mesh filter cloth to prepare a water dispersion of a vinyl resin (a2-1) including carboxyl groups.

Synthesis Example 5

Synthesis of Vinyl Resin (a2-2)

In a reaction container equipped with a stirrer, a reflux cooling tube, a nitrogen introduction tube, a thermometer, and a dropping funnel, 115 parts by mass of deionized water and 4 parts by mass of LATEMUL E-118B (produced by Kao Corporation, active ingredient: 25% by mass) were charged. The temperature was increased to 75° C. while nitrogen was blown into the reaction container. Under stirring, to the reaction container, a vinyl monomer mixture of 46 parts by mass of methyl methacrylate, 45 parts by mass of n-butyl acrylate, 2 parts by mass of methacrylic acid, 5 parts by mass of 2-hydroxyethyl methacrylate, and 2 parts by mass of N-methylolacrylamide; and a portion (5 parts by mass) of a monomer pre-emulsion prepared by mixing 4 parts by mass of AQUALON KH-1025 (produced by DKS Co. Ltd., active ingredient: 25% by mass) with 15 parts by mass of deionized water were added. Subsequently, 0.1 parts by mass of potassium persulfate was further added thereto. While the temperature inside the reaction container was kept at 75° C., polymerization was performed for 60 minutes. Then, while the temperature inside the reaction container was kept at 75° C., the remaining portion of the monomer pre-emulsion (114 parts by mass) and 30 parts by mass of an aqueous potassium persulfate solution (active ingredient: 1.0% by mass) were each added dropwise to the reaction container using a different dropping funnel over 180 minutes. After the dropwise addition was completed, stirring was performed for 60 minutes at the same temperature. Then, the temperature inside the reaction container was reduced to 40° C., and ammonia water (active ingredient: 10% by mass) was added to the reaction container so that the pH of the resulting water dispersion in the reaction container became 8.5. Subsequently, deionized water was added to the reaction container so that the nonvolatile content of the water dispersion became 20% by mass. The water dispersion was filtered through a 200-mesh filter cloth to prepare a water dispersion of a vinyl resin (a2-2) including carboxyl groups and N-methylolacrylamide groups.

Synthesis Example 6

Synthesis of Vinyl Resin (a2-3)

In a reaction container equipped with a stirrer, a reflux cooling tube, a nitrogen introduction tube, a thermometer, and a dropping funnel, 115 parts by mass of deionized water and 4 parts by mass of LATEMUL E-118B (produced by Kao Corporation, active ingredient: 25% by mass) were charged. The temperature was increased to 75° C. while nitrogen was blown into the reaction container. Under stirring, to the reaction container, a vinyl monomer mixture of 46 parts by mass of methyl methacrylate, 43 parts by mass of n-butyl acrylate, 2 parts by mass of methacrylic acid, 5 parts by mass of 2-hydroxyethyl methacrylate, and 4 parts by mass of diacetoneacrylamide; and a portion (5 parts by mass) of a monomer pre-emulsion prepared by mixing 4 parts by mass of AQUALON KH-1025 (produced by DKS Co. Ltd., active ingredient: 25% by mass) with 15 parts by mass of deionized water were added. Subsequently, 0.1 parts by mass of potassium persulfate was further added thereto. While the temperature inside the reaction container was kept at 75° C., polymerization was performed for 60 minutes. Then, while the temperature inside the reaction container was kept at 75° C., the remaining portion of the monomer pre-emulsion (114 parts by mass) and 30 parts by mass of an aqueous potassium persulfate solution (active ingredient: 1.0% by mass) were each added dropwise to the reaction container using a different dropping funnel over 180 minutes. After the dropwise addition was completed, stirring was performed for 60 minutes at the same temperature. Then, the temperature inside the reaction container was reduced to 40° C., and ammonia water (active ingredient: 10% by mass) was added to the reaction container so that the pH of the resulting water dispersion in the reaction container became 8.5. Subsequently, deionized water was added to the reaction container so that the nonvolatile content of the water dispersion became 20% by mass. The water dispersion was filtered through a 200-mesh filter cloth to prepare a water dispersion of a vinyl resin (a2-3) including carboxyl groups and keto groups.

Synthesis Example 7

Synthesis of Vinyl Resin (a2-4)

Into a reaction container equipped with a stirrer, a reflux cooling tube, a nitrogen-introduction tube, a thermometer, and a dropping funnel, a vinyl monomer mixture of 48 parts by mass of methyl methacrylate, 43 parts by mass of n-butyl acrylate, 5 parts by mass of 2-hydroxyethyl methacrylate, and 4 parts by mass of "Karenz MOI-BM" (blocked-isocyanate-group-containing vinyl monomer produced by Showa Denko K.K.) was mixed with 400 parts by mass of ethyl acetate. The temperature was increased to 50° C. under stirring in a nitrogen atmosphere. Subsequently, 2 parts by mass of 2,2'-azobis(2-methylbutyronitrile) was charged into the reaction container. The reaction of the resulting mixture was carried out for 24 hours to prepare an ethyl acetate solution of a vinyl resin (a2-4), which was 500 parts by mass (nonvolatile content: 20% by mass) of a mixture of a blocked-isocyanate-group-containing vinyl polymer having a weight-average molecular weight of 400 thousand and ethyl acetate.

Synthesis Example 8

Synthesis of Vinyl Resin (a2-5)

Into a reaction container equipped with a stirrer, a reflux cooling tube, a nitrogen-introduction tube, a thermometer, and a dropping funnel, a vinyl monomer mixture of 48 parts by mass of methyl methacrylate, 43 parts by mass of n-butyl acrylate, 5 parts by mass of 2-hydroxyethyl methacrylate, and 4 parts by mass of glycidyl methacrylate was mixed with 400 parts by mass of ethyl acetate. The temperature was increased to 50° C. under stirring in a nitrogen atmosphere. Subsequently, 2 parts by mass of 2,2'-azobis(2-methylbutyronitrile) was charged into the reaction container. The reaction of the resulting mixture was carried out for 24 hours to prepare an ethyl acetate solution of a vinyl resin (a2-5), which was 500 parts by mass (nonvolatile content: 20% by mass) of a mixture of a glycidyl-group-containing vinyl polymer having a weight-average molecular weight of 400 thousand and ethyl acetate.

Synthesis Example 9

Synthesis of Vinyl Resin (a2-6)

Into a reaction container equipped with a stirrer, a reflux cooling tube, a nitrogen-introduction tube, a thermometer, and a dropping funnel, a vinyl monomer mixture of 48 parts by mass of methyl methacrylate, 45 parts by mass of n-butyl acrylate, 5 parts by mass of 2-hydroxyethyl methacrylate, and 2 parts by mass of maleic anhydride was mixed with 400 parts by mass of ethyl acetate. The temperature was increased to 50° C. under stirring in a nitrogen atmosphere. Subsequently, 2 parts by mass of 2,2'-azobis(2-methylbutyronitrile) was charged into the reaction container. The reaction of the resulting mixture was carried out for 24 hours to prepare an ethyl acetate solution of a vinyl resin (a2-6), which was 500 parts by mass (nonvolatile content: 20% by mass) of a mixture of a carboxylic-anhydride-group-containing vinyl polymer having a weight-average molecular weight of 400 thousand and ethyl acetate.

Synthesis Example 10

Synthesis of Composite Resin Particles 1 Including Urethane Resin and Vinyl Resin In a nitrogen-purged container equipped with a thermometer, a nitrogen gas introduction tube, and a stirrer, 100 parts by mass of a polyester polyol (polyester polyol prepared by reacting 1,4-cyclohexanedimethanol with neopentyl glycol and adipic acid, hydroxyl group equivalent: 1000 g/eq.), 17.4 parts by mass of 2,2-dimethylolpropionic acid, 21.7 parts by mass of 1,4-cyclohexanedimethanol, and 106.2 parts by mass of dicyclohexylmethane diisocyanate were mixed with 178 parts by mass of methyl ethyl ketone. The reaction of the resulting mixture was carried out to prepare an organic solvent solution of a urethane prepolymer including an isocyanate group at the terminal of the molecule. To the organic solvent solution of a urethane prepolymer, 13.3 parts by mass of triethylamine was added to neutralize some or all of the carboxyl groups of the urethane resin. Subsequently, 277 parts by mass of water was further added to the container, and the resulting mixture was vigorously stirred. Thus, a water dispersion of a urethane resin including carboxyl groups was prepared. To the water dispersion, 8 parts by mass of a 25%-by-mass aqueous ethylenediamine solution was added. The resulting mixture was stirred to perform chain elongation of a particulate polyurethane resin. The polyurethane resin was subjected to aging, and the solvent was removed from the polyurethane resin. Thus, a water dispersion of a urethane resin having a solid content concentration of 30% by mass was prepared. The urethane resin prepared above had an acid value of 30 and a weight-average molecular weight of 55000.

Into a reaction container equipped with a stirrer, a reflux cooling tube, a nitrogen introduction tube, a thermometer, a dropping funnel for dropping monomer mixtures, and a dropping funnel for dropping polymerization catalysts, 280 parts by mass of deionized water and 333 parts by mass of the water dispersion of the urethane resin prepared above were charged. The temperature was increased to 80° C. while nitrogen was blown into the reaction container. To the reaction container heated at 80° C., a monomer mixture of 48 parts by mass of methyl methacrylate, 44 parts by mass of n-butyl acrylate, and 8 parts by mass of 2-hydroxyethyl methacrylate and 20 parts by mass of an aqueous ammonium persulfate solution (concentration: 0.5% by mass) were each added dropwise using a different dropping funnel over 120 minutes under stirring while the temperature inside the reaction container was kept at 80±2° C. Thus, polymerization was performed in order to prepare a vinyl polymer that constitutes a core layer. After the dropwise addition was completed, stirring was performed for 60 minutes at the same temperature. Then, the temperature inside the reaction container was reduced to 40° C. Subsequently, deionized water was added to the reaction container so that the nonvolatile content of the resulting mixture became 20% by mass. The mixture was then filtered through a 200-mesh filter cloth. Thus, a water dispersion of composite resin particles 1 constituted by a shell layer composed of the above-described urethane resin and a core layer composed of a vinyl polymer including carboxyl groups was prepared.

Synthesis Example 11

Synthesis of Composite Resin Particles 2 Including Urethane Resin and Vinyl Resin In a nitrogen-purged container equipped with a thermometer, a nitrogen gas introduction tube, and a stirrer, 100 parts by mass of a polyester polyol (polyester polyol prepared by reacting 1,4-cyclohexanedimethanol with neopentyl glycol and adipic acid, hydroxyl group equivalent: 1000 g/eq.), 17.4 parts by mass of 2,2-dimethylolpropionic acid, 21.7 parts by mass of 1,4-cyclohexanedimethanol, and 106.2 parts by mass of dicyclohexylmethane diisocyanate were mixed with 178 parts by mass of methyl ethyl ketone. The reaction of the resulting mixture was carried out to prepare an organic solvent solution of a urethane prepolymer including an isocyanate group at the terminal of the molecule. To the organic solvent solution of a urethane prepolymer, 13.3 parts by mass of triethylamine was added to neutralize some or all of the carboxyl groups of the urethane resin. Subsequently, 277 parts by mass of water was further added to the container, and the resulting mixture was vigorously stirred. Thus, a water dispersion of a urethane resin including carboxyl groups was prepared. To the water dispersion, 8 parts by mass of a 25%-by-mass aqueous ethylenediamine solution was added. The resulting mixture was stirred to perform chain elongation of a particulate polyurethane resin. The polyurethane resin was subjected to aging, and the solvent was removed from the polyurethane resin. Thus, a water dispersion of a urethane resin having a solid content concentration of 30% by mass was prepared. The urethane resin prepared above had an acid value of 30 and a weight-average molecular weight of 55000.

Into a reaction container equipped with a stirrer, a reflux cooling tube, a nitrogen introduction tube, a thermometer, a dropping funnel for dropping monomer mixtures, and a dropping funnel for dropping polymerization catalysts, 280 parts by mass of deionized water and 333 parts by mass of the water dispersion of the urethane resin prepared above were charged. The temperature was increased to 80° C. while nitrogen was blown into the reaction container. To the reaction container heated at 80° C., a vinyl monomer mixture of 46 parts by mass of methyl methacrylate, 45 parts by mass of n-butyl acrylate, 2 parts by mass of methacrylic acid, 4 parts by mass of 2-hydroxyethyl methacrylate, and 4 parts by mass of N-n-butoxymethylacrylamide, a monomer pre-emulsion prepared by mixing 4 parts by mass of AQUALON KH-1025 (produced by DKS Co. Ltd., active ingredient: 25% by mass) with 15 parts by mass of deionized water, and 20 parts by mass of an aqueous ammonium persulfate solution (concentration: 0.5% by mass) were each added dropwise using a different dropping funnel over 120 minutes under stirring while the temperature inside the reaction container was kept at 80±2° C. Thus, polymerization was performed in order to prepare a vinyl polymer that constitutes a core layer. After the dropwise addition was completed, stirring was performed for 60 minutes at the same temperature. Then, the temperature inside the reaction container was reduced to 40° C. Subsequently, deionized water was added to the reaction container so that the nonvolatile content of the resulting mixture became 20% by mass. The mixture was then filtered through a 200-mesh filter cloth. Thus, a water dispersion of composite resin particles 2 constituted by a shell layer composed of the above-described urethane resin and a core layer composed of a vinyl polymer including carboxyl groups and N-n-butoxymethylacrylamide groups was prepared.

Synthesis Example 12

Synthesis of Composite Resin Particles 3 Including Urethane Resin and Vinyl Resin In a nitrogen-purged container equipped with a thermometer, a nitrogen gas introduction tube, and a stirrer, 100 parts by mass of a polyester polyol (polyester polyol prepared by reacting 1,4-cyclohexanedimethanol with neopentyl glycol and adipic acid, hydroxyl group equivalent: 1000 g/eq.), 17.4 parts by mass of 2,2-dimethylolpropionic acid, 21.7 parts by mass of 1,4-cyclohexanedimethanol, and 106.2 parts by mass of dicyclohexylmethane diisocyanate were mixed with 178 parts by mass of methyl ethyl ketone. The reaction of the resulting mixture was carried out to prepare an organic solvent solution of a urethane prepolymer including an isocyanate group at the terminal of the molecule. To the organic solvent solution of a urethane prepolymer, 13.3 parts by mass of triethylamine was added to neutralize some or all of the carboxyl groups of the urethane resin. Subsequently, 277 parts by mass of water was further added to the container, and the resulting mixture was vigorously stirred. Thus, a water dispersion of a urethane resin including carboxyl groups was prepared. To the water dispersion, 8 parts by mass of a 25%-by-mass aqueous ethylenediamine solution was added. The resulting mixture was stirred to perform chain elongation of a particulate polyurethane resin. The polyurethane resin was subjected to aging, and the solvent was removed from the polyurethane resin. Thus, a water dispersion of a urethane resin having a solid content concentration of 30% by mass was prepared. The urethane resin prepared above had an acid value of 30 and a weight-average molecular weight of 55000.

Into a reaction container equipped with a stirrer, a reflux cooling tube, a nitrogen introduction tube, a thermometer, a dropping funnel for dropping monomer mixtures, and a dropping funnel for dropping polymerization catalysts, 280 parts by mass of deionized water and 400 parts by mass of the water dispersion of the urethane resin prepared above were charged. The temperature was increased to 80° C. while nitrogen was blown into the reaction container. To the reaction container heated at 80° C., a monomer mixture of 34 parts by mass of methyl methacrylate, 30 parts by mass of n-butyl acrylate, 6 parts by mass of 2-hydroxyethyl methacrylate, and 10 parts by mass of diacetone acrylamide and 20 parts by mass of an aqueous ammonium persulfate solution (concentration: 0.5% by mass) were each added dropwise using a different dropping funnel over 120 minutes under stirring while the temperature inside the reaction container was kept at 80±2° C. Thus, polymerization was performed in order to prepare a vinyl polymer that constitutes a core layer. After the dropwise addition was completed, stirring was performed for 60 minutes at the same temperature. Then, the temperature inside the reaction container was reduced to 40° C. Subsequently, deionized water was added to the reaction container so that the nonvolatile content of the resulting mixture became 20% by mass. The mixture was then filtered through a 200-mesh filter cloth. Thus, a water dispersion of composite resin particles 3 constituted by a shell layer composed of the above-described urethane resin and a core layer composed of a vinyl polymer including carboxyl groups and keto groups was prepared.

Synthesis Example 13

Synthesis of Composite Resin Particles 4 Including Urethane Resin and Vinyl Resin In a nitrogen-purged container equipped with a thermometer, a nitrogen gas introduction tube, and a stirrer, 100 parts by mass of a polyester polyol (polyester polyol prepared by reacting 1,4-cyclohexanedimethanol with neopentyl glycol and adipic acid, hydroxyl group equivalent: 1000 g/eq.), 17.4 parts by mass of 2,2-dimethylolpropionic acid, 21.7 parts by mass of 1,4-cyclohexanedimethanol, and 106.2 parts by mass of dicyclohexylmethane diisocyanate were mixed with 178 parts by mass of methyl ethyl ketone. The reaction of the resulting mixture was carried out to prepare an organic solvent solution of a urethane prepolymer including an isocyanate group at the terminal of the molecule. To the organic solvent solution of a urethane prepolymer, 13.3 parts by mass of triethylamine was added to neutralize some or all of the carboxyl groups of the urethane resin. Subsequently, 277 parts by mass of water was further added to the container, and the resulting mixture was vigorously stirred. Thus, a water dispersion of a urethane resin including carboxyl groups was prepared. To the water dispersion, 8 parts by mass of a 25%-by-mass aqueous ethylenediamine solution was added. The resulting mixture was stirred to perform chain elongation of a particulate polyurethane resin. The polyurethane resin was subjected to aging, and the solvent was removed from the polyurethane resin. Thus, a water dispersion of a urethane resin having a solid content concentration of 30% by mass was prepared. The urethane resin prepared above had an acid value of 30 and a weight-average molecular weight of 55000.

Into a reaction container equipped with a stirrer, a reflux cooling tube, a nitrogen introduction tube, a thermometer, a dropping funnel for dropping monomer mixtures, and a dropping funnel for dropping polymerization catalysts, 280 parts by mass of deionized water and 400 parts by mass of the water dispersion of the urethane resin prepared above were charged. The temperature was increased to 80° C. while nitrogen was blown into the reaction container. To the reaction container heated at 80° C., a monomer mixture of 36 parts by mass of methyl methacrylate, 34 parts by mass of n-butyl acrylate, 6 parts by mass of 2-hydroxyethyl methacrylate, and 4 parts by mass of glycidyl methacrylate and 20 parts by mass of an aqueous ammonium persulfate solution (concentration: 0.5% by mass) were each added dropwise using a different dropping funnel over 120 minutes under stirring while the temperature inside the reaction container was kept at 80±2° C. Thus, polymerization was performed in order to prepare a vinyl polymer that constitutes a core layer. After the dropwise addition was completed, stirring was performed for 60 minutes at the same temperature. Then, the temperature inside the reaction container was reduced to 40° C. Subsequently, deionized water was added to the reaction container so that the nonvolatile content of the resulting mixture became 20% by mass. The mixture was then filtered through a 200-mesh filter cloth. Thus, a water dispersion of composite resin particles 4 constituted by a shell layer composed of the above-described urethane resin and a core layer composed of a vinyl polymer including glycidyl groups was prepared.

Synthesis Example 14

Synthesis of Composite Resin Particles 5 Including Urethane Resin and Vinyl Resin In a nitrogen-purged container equipped with a thermometer, a nitrogen gas introduction tube, and a stirrer, 100 parts by mass of a polyester polyol (polyester polyol prepared by reacting 1,4-cyclohexanedimethanol with neopentyl glycol and adipic acid, alicyclic structure content in the polyester polyol: 1426 mmol/kg, hydroxyl group equivalent: 1000 g/eq.), 17.6 parts by mass of 2,2-dimethylolpropionic acid, 21.7 parts by mass of 1,4-cyclohexanedimethanol, and 106.2 parts by mass of dicyclohexylmethane diisocyanate were mixed with 178 parts by mass of methyl ethyl ketone. The reaction of the resulting mixture was carried out to prepare an organic solvent solution of a urethane prepolymer including an isocyanate group at the terminal of the molecule. To the organic solvent solution of a urethane resin, 13.3 parts by mass of triethylamine was added to neutralize some or all of the carboxyl groups of the urethane resin. Subsequently, 380 parts by mass of water was further added to the container, and the resulting mixture was vigorously stirred. Thus, an aqueous dispersion of a urethane resin having an alicyclic structure and carboxyl groups was prepared. To the aqueous dispersion, 8.8 parts by mass of a 25%-by-mass aqueous ethylenediamine solution was added. The resulting mixture was stirred to perform chain elongation of a particulate polyurethane resin. The polyurethane resin was subjected to aging, and the solvent was removed from the polyurethane resin. Thus, an aqueous dispersion of a urethane resin having a solid content concentration of 30% by mass was prepared. The urethane resin prepared above had an acid value of 30, an alicyclic structure content of 4452 mmol/kg, which was calculated from the ratio of the raw materials charged, and a weight-average molecular weight of 53000.

Into a reaction container equipped with a stirrer, a reflux cooling tube, a nitrogen introduction tube, a thermometer, a dropping funnel for dropping monomer mixtures, and a dropping funnel for dropping polymerization catalysts, 140 parts by mass of deionized water and 100 parts by mass of the water dispersion of the urethane resin prepared above were charged. The temperature was increased to 80° C. while nitrogen was blown into the reaction container. To the reaction container heated at 80° C., a monomer mixture of 50.0 parts by mass of methyl methacrylate, 30.0 parts by mass of n-butyl acrylate, and 20.0 parts by mass of N-n-butoxymethylacrylamide and 20 parts by mass of an aqueous ammonium persulfate solution (concentration: 0.5% by mass) were each added dropwise using a different dropping funnel over 120 minutes under stirring while the temperature inside the reaction container was kept at 80±2° C. Thus, polymerization was performed in order to prepare a vinyl polymer that constitutes a core layer. After the dropwise addition was completed, stirring was performed for 60 minutes at the same temperature to form a water dispersion of composite resin particles constituted by a shell layer composed of the above-described urethane resin and a core layer composed of the above-described vinyl polymer.

Then, the temperature inside the reaction container was reduced to 40° C. Subsequently, deionized water was added to the reaction container so that the nonvolatile content of the resulting mixture became 20.0% by mass. The mixture was then filtered through a 200-mesh filter cloth. Thus, a water dispersion of composite resin particles 5 used in the present invention was prepared.

Synthesis Example 15

Synthesis of Composite Resin Particles 6 Including Urethane Resin and Vinyl Resin In a nitrogen-purged container equipped with a thermometer, a nitrogen gas introduction tube, and a stirrer, 100 parts by mass of a polyester polyol (polyester polyol prepared by reacting 1,4-cyclohexanedimethanol with neopentyl glycol and adipic acid, alicyclic structure content in the polyester polyol: 1426 mmol/kg, hydroxyl group equivalent: 1000 g/eq.), 17.6 parts by mass of 2,2-dimethylolpropionic acid, 21.7 parts by mass of 1,4-cyclohexanedimethanol, and 106.2 parts by mass of dicyclohexylmethane diisocyanate were mixed with 178 parts by mass of methyl ethyl ketone. The reaction of the resulting mixture was carried out to prepare an organic solvent solution of a urethane prepolymer including an isocyanate group at the terminal of the molecule. To the organic solvent solution of a urethane resin, 13.3 parts by mass of triethylamine was added to neutralize some or all of the carboxyl groups of the urethane resin. Subsequently, 380 parts by mass of water was further added to the container, and the resulting mixture was vigorously stirred. Thus, an aqueous dispersion of a urethane resin having an alicyclic structure and carboxyl groups was prepared. To the aqueous dispersion, 8.8 parts by mass of a 25%-by-mass aqueous ethylenediamine solution was added. The resulting mixture was stirred to perform chain elongation of a particulate polyurethane resin. The polyurethane resin was subjected to aging, and the solvent was removed from the polyurethane resin. Thus, an aqueous dispersion of a urethane resin having a solid content concentration of 30% by mass was prepared. The urethane resin prepared above had an acid value of 30, an alicyclic structure content of 4452 mmol/kg, which was calculated from the ratio of the raw materials charged, and a weight-average molecular weight of 53000.

Into a reaction container equipped with a stirrer, a reflux cooling tube, a nitrogen introduction tube, a thermometer, a dropping funnel for dropping monomer mixtures, and a dropping funnel for dropping polymerization catalysts, 140 parts by mass of deionized water and 100 parts by mass of the water dispersion of the urethane resin prepared above were charged. The temperature was increased to 80° C. while nitrogen was blown into the reaction container. To the reaction container heated at 80° C., a monomer mixture of 40.0 parts by mass of methyl methacrylate, 30.0 parts by mass of n-butyl acrylate, 20.0 parts by mass of N-n-butoxymethylacrylamide, and 10.0 parts by mass of 2-hydroxyethyl methacrylate and 20 parts by mass of an aqueous ammonium persulfate solution (concentration: 0.5% by mass) were each added dropwise using a different dropping funnel over 120 minutes under stirring while the temperature inside the reaction container was kept at 80±2° C. Thus, polymerization was performed in order to prepare a vinyl polymer that constitutes a core layer. After the dropwise addition was completed, stirring was performed for 60 minutes at the same temperature to form a water dispersion of composite resin particles constituted by a shell layer composed of the above-described urethane resin and a core layer composed of the above-described vinyl polymer. Then, the temperature inside the reaction container was reduced to 40° C. Subsequently, deionized water was added to the reaction container so that the nonvolatile content of the resulting mixture became 20.0% by mass. The mixture was then filtered through a 200-mesh filter cloth. Thus, a water dispersion of composite resin particles 6 used in the present invention was prepared.

Examples 1 to 15

The compositions prepared in Synthesis Examples 1 to 15 were each applied to the surface of a printing object (substrate), which was a polyimide film ("Kapton200H" produced by DU PONT-TORAY CO., LTD.), using a spin coater so that a film having a thickness of 0.1 μm was formed after being dried. The resulting coating film was dried using a hot-air drying machine. Thus, a receiving layer (A) was formed on the surface of the printing object (substrate).

A linear plating-core pattern having a line width of about 20 μm was formed on the polyimide film including the receiving layer using the plating-core ink for reverse printing (b-1) and a glass relief plate having about-20-μm linear recesses (negative pattern) in the following steps of reverse offset printing.

A smooth silicone surface of the blanket, which served as a releasing surface, was uniformly coated with the ink using a slit coater in an atmosphere having a temperature of 25° C. and a relative humidity of 48% so that the deposited ink film had a thickness of about 2 μm before being dried. The ink film was left standing for 1 minute (standby time) to be air-dried. Subsequently, the glass relief printing plate having the negative pattern, which served as a relief plate, was lightly pressed against the ink-coated surface of the blanket and then separated from the blanket to remove the ink deposited on the surface of the blanket. Thus, a linear drawing line having a line width of about 20 μm was formed on the blanket. The ink was suitably removed using the relief plate, which contributed to formation of sharp-edged lines. The ink pattern formed on the blanket was, in turn, pressed against the polyimide film including the receiving layer, which served as a printing object, to transfer the ink pattern to the receiving layer. The transferred ink pattern was dried at 150° C. for 1 hour to form a plating-core ink pattern.

The surface of the plating-core pattern was then subjected to a corona discharge treatment using AP-T01 (normal-pressure plasma treatment system produced by SEKISUI CHEMICAL CO., LTD., gas: air (oxygen concentration: about 21% by mass), flow rate: 20 Liter/minute, output: 150 W, treatment time: 5 seconds).

Subsequently, an electroless plating process was performed in the following manner. The layer subjected to the corona discharge treatment was immersed in a catalyst bath (OPCSALM/OPC-80 produced by Okuno Chemical Industries Co., Ltd.) for 5 minutes and washed with water. The layer was subsequently immersed, for 5 minutes, in an accelerator bath (OPC-555 produced by Okuno Chemical Industries Co., Ltd.) kept at 25° C. and washed with water. Then, the layer was immersed in an electroless copper-plating bath (ATS Addcopper produced by Okuno Chemical Industries Co., Ltd.) kept at 30° C. and washed with water. Thus, a plating layer was formed.

Examples 16 and 17

The compositions prepared in Synthesis Examples 14 and 15 were applied using a spin coater as in Examples 1 to 15 so that the deposited film had a thickness of 0.1 μm after being dried. The deposited film was dried using a hot-air drying machine to form a receiving layer on the surface of the printing object.

A metal pattern was formed as in Examples 1 to 15, except that the plating-core ink for reverse printing (b-2) was used instead of the plating-core ink for reverse printing (b-1).

Comparative Examples 1 to 15

The compositions prepared in Synthesis Examples 1 to 15 were each applied to the surface of a printing object, which was a polyimide film ("Kapton200H" produced by DU PONT-TORAY CO., LTD.), using a spin coater so that a film having a thickness of 0.1 μm was formed after being dried. The resulting coating film was dried using a hot-air drying machine. Thus, a receiving layer was formed on the surface of the printing object.

The plating-core ink for IJ printing (b') was printed on the receiving layer using an ink-jet printer (ink-jet test machine "EB150" and evaluation printer head "KM512M" produced by Konicaminolta IJ Technologies, Inc.). The printed ink was dried at 150° C. for 1 hour to form a linear plating-core pattern having a line width of about 100 μm on the polyimide film including the receiving layer.

The surface of the plating-core pattern was then subjected to a corona discharge treatment using AP-T01 (normal-pressure plasma treatment system produced by SEKISUI CHEMICAL CO., LTD., gas: air (oxygen concentration: about 21% by mass), flow rate: 20 Liter/minute, output: 150 W, treatment time: 5 seconds).

Subsequently, an electroless plating process was performed in the following manner. The layer subjected to the corona discharge treatment was immersed in a catalyst bath (OPCSALM/OPC-80 produced by Okuno Chemical Industries Co., Ltd.) for 5 minutes and washed with water. The layer was subsequently immersed, for 5 minutes, in an accelerator bath (OPC-555 produced by Okuno Chemical Industries Co., Ltd.) kept at 25° C. and washed with water. Then, the layer was immersed in an electroless copper-plating bath (ATS Addcopper produced by Okuno Chemical Industries Co., Ltd.) kept at 30° C. and washed with water. Thus, a plating layer was formed.

Comparative Example 16

Formation of a metal pattern was attempted as in Examples 1 to 15, except that receiving layer was formed.

Comparative Example 17

Formation of a metal pattern was attempted as in Examples 16 and 17, except that no receiving layer was formed.

[Method for Evaluating Adhesion of Plating-Core Pattern]

Cellophane adhesive tape ("CT405AP-24", 24 mm, produced by Nichiban Co., Ltd.) was stuck to the surface of the plating-core pattern by hand. Subsequently, the cellophane adhesive tape was peeled off in a direction perpendicular to the surface of the plating-core pattern. Thus, the adhesion of the plating-core pattern was evaluated by visually inspecting the adhesive side of the peeled cellophane adhesive tape to determine whether any attachment was present on the adhesive side.

Evaluation was made according to the following criteria: "A" was given when no part of the plating-core pattern adhered to the adhesive side of the peeled cellophane adhesive tape; "B" was given when a portion of the plating-core pattern which was peeled off from the receiving layer and adhered to the adhesive side of the adhesive tape occupied less than 3% of the area at which the plating-core pattern was brought into contact with the adhesive tape; "C" was given when a portion of the plating-core pattern which was peeled off from the receiving layer and adhered to the adhesive side of the adhesive tape occupied 3% or more and less than 30% of the area at which the plating-core pattern was brought into contact with the adhesive tape; and "D" was given when a portion of the plating-core pattern which was peeled off from the receiving layer and adhered to the adhesive side of the adhesive tape occupied 30% or more of the area at which the plating-core pattern was brought into contact with the adhesive tape.

[Method for Evaluating Cross-Sectional Shape of Metal Pattern]

The cross-sectional shape of the metal pattern was observed by using an optical interference microscope (Micromap produced by Ryoka Systems Inc.). Evaluation was made according to the following criteria: "Good" was given when the cross-sectional shape of the metal pattern was flat; and "Poor" was given when the cross-sectional shape of the metal pattern was concave (coffee-ring-like) or convex (D-shape).

[Method for Evaluating Adhesion of Metal Pattern]

The metal pattern prepared above was bent 180 degrees so that the plated layer constituting the metal pattern prepared above was outwardly disposed, and the metal pattern was unbent. Evaluation was made according to the following criteria: "A" was given when no peeling of the metal pattern was visually confirmed; "B" was given when a small portion of the metal pattern was peeled off; "C" was given when a portion of the metal pattern was peeled off; and "D" was given when a portion of the plating-core pattern was peeled off from the receiving layer during the plating step.

Tables 1 and 2 summarize the results of the evaluations described above.

TABLE 1

|  | Example 1 | Example 2 | Example 3 | Example 4 | Example 5 |
|---|---|---|---|---|---|
| Resin composition | Synthesis example 1 | Synthesis example 2 | Synthesis example 3 | Synthesis example 4 | Synthesis example 5 |
| Plating-core ink | Plating-core ink for reverse printing (b-1) | | | | |
| Adhesion of plating-core pattern | A | B | B | B | A |
| Cross-sectional shape of high-definition metal pattern | Good | Good | Good | Good | Good |
| Adhesion of high-definition metal pattern | A | B | B | B | A |

|  | Example 6 | Example 7 | Example 8 | Example 9 | Example 10 |
|---|---|---|---|---|---|
| Resin composition | Synthesis example 6 | Synthesis example 7 | Synthesis example 8 | Synthesis example 9 | Synthesis example 10 |
| Plating-core ink | Plating-core ink for reverse printing (b-1) | | | | |
| Adhesion of plating-core pattern | A | B | A | A | B |
| Cross-sectional shape of high-definition metal pattern | Good | Good | Good | Good | Good |
| Adhesion of high-definition metal pattern | A | B | A | B | B |

|  | Example 11 | Example 12 | Example 13 | Example 14 | Example 15 |
|---|---|---|---|---|---|
| Resin composition | Synthesis example 11 | Synthesis example 12 | Synthesis example 13 | Synthesis example 14 | Synthesis example 15 |
| Plating-core ink | Plating-core ink for reverse printing (b-1) | | | | |
| Adhesion of plating-core pattern | A | A | A | A | B |
| Cross-sectional shape of high-definition metal pattern | Good | Good | Good | Good | Good |
| Adhesion of high-definition metal pattern | A | A | A | A | A |

|  | Example 16 | Example 17 |
|---|---|---|
| Resin composition | Synthesis example 14 | Synthesis example 15 |
| Plating-core ink | Plating-core ink for reverse printing (b-2) | |
| Adhesion of plating-core pattern | B | B |
| Cross-sectional shape of high-definition metal pattern | Good | Good |
| Adhesion of high-definition metal pattern | C | C |

TABLE 2

|  | Comparative example 1 | Comparative example 2 | Comparative example 3 | Comparative example 4 | Comparative example 5 |
|---|---|---|---|---|---|
| Resin composition | Synthesis example 1 | Synthesis example 2 | Synthesis example 3 | Synthesis example 4 | Synthesis example 5 |
| Plating-core ink | Plating-core ink for IJ printing (b') | | | | |
| Adhesion of plating-core pattern | A | B | B | B | A |
| Cross-sectional shape of high-definition metal pattern | Poor | Poor | Poor | Poor | Poor |
| Adhesion of high-definition metal pattern | A | B | B | B | A |

TABLE 2-continued

|  | Comparative example 6 | Comparative example 7 | Comparative example 8 | Comparative example 9 | Comparative example 10 |
|---|---|---|---|---|---|
| Resin composition | Synthesis example 6 | Synthesis example 7 | Synthesis example 8 | Synthesis example 9 | Synthesis example 10 |
| Plating-core ink | Plating-core ink for IJ printing (b') | | | | |
| Adhesion of plating-core pattern | A | B | A | A | B |
| Cross-sectional shape of high-definition metal pattern | Poor | Poor | Poor | Poor | Poor |
| Adhesion of high-definition metal pattern | A | B | A | B | B |

|  | Comparative example 11 | Comparative example 12 | Comparative example 13 | Comparative example 14 | Comparative example 15 |
|---|---|---|---|---|---|
| Resin composition | Synthesis example 11 | Synthesis example 12 | Synthesis example 13 | Synthesis example 14 | Synthesis example 15 |
| Plating-core ink | Plating-core ink for IJ printing (b') | | | | |
| Adhesion of plating-core pattern | A | A | A | A | A |
| Cross-sectional shape of high-definition metal pattern | Poor | Poor | Poor | Poor | Poor |
| Adhesion of high-definition metal pattern | A | A | A | A | A |

|  | Comparative example 11 | Comparative example 12 |
|---|---|---|
| Resin composition | None | None |
| Plating-core ink | (b-1) | (b-2) |
| Adhesion of plating-core pattern | C | D |
| Cross-sectional shape of high-definition metal pattern | Good | Good |
| Adhesion of high-definition metal pattern | D | D |

INDUSTRIAL APPLICABILITY

The high-definition metal pattern formed by the pattern-forming method according to the present invention can be used as an interlayer electrode of multilayer ceramic capacitors (MLCC), and a microbump used for joining of chip-on films (COF).

REFERENCE SIGNS LIST

1: INK FILM
2: BLANKET
3: RELIEF PLATE
4: OBJECT TO WHICH A PATTERN IS TRANSFERRED

The invention claimed is:

1. A method for forming a high-definition metal pattern, the method comprising the steps of:
   (1) forming a receiving layer on a substrate by coating the substrate with a resin composition, the resin composition including a urethane resin having a weight-average molecular weight of five thousand or more or a vinyl resin, and a medium;
   wherein the urethane resin includes an alicyclic structure and a hydrophilic group, the content of the alicyclic structure being 2000 to 5500 mmol/kg relative to the total amount of the urethane resin, and
   wherein the vinyl resin is produced by polymerizing a vinyl monomer mixture of 10% to 70% by mass of methyl methacrylate and 10% to 50% by mass of a (meth)acrylic acid alkyl ester including an alkyl group having 2 to 12 carbon atoms,
   (2) forming a plating-core pattern on the receiving layer by printing an ink on the receiving layer by reverse offset printing, the ink including a particle that serves as a plating core; and
   (3) depositing a metal on the plating-core pattern formed in the step (2) by electroless plating.

2. The method for forming a high-definition metal pattern according to claim 1, wherein the particle that serves as a plating core is a metal nanoparticle having a mean volume diameter (Mv) of 2 to 100 nm, the metal nanoparticle being protected using an organic compound including a basic nitrogen atom and being dispersed in the ink.

3. The method for forming a high-definition metal pattern according to claim 2, wherein the urethane resin or the vinyl resin included in the resin composition includes a functional group capable of crosslinking with the organic compound including a basic nitrogen atom, the organic compound being used for protecting the metal nanoparticle.

4. The method for forming a high-definition metal pattern according to claim 1, wherein the ink further includes a fluorine-based surface-energy modifier and/or a silicone-based surface-energy modifier.

5. The method for forming a high-definition metal pattern according to claim 1, wherein the reverse offset printing includes the steps of:
   (i) forming a uniform ink film on a liquid-repellent surface of a blanket;
   (ii) pressing a relief printing plate against the ink film to remove part of the ink which is brought into contact with the relief printing plate from the blanket; and
   (iii) transferring the ink remaining on the blanket to a printing object to form a desired pattern.

6. The method for forming a high-definition metal pattern, the method comprising the steps of:
   (1) forming a receiving layer on a substrate by coating the substrate with a resin composition, the resin composition including a urethane resin having a weight-average molecular weight of five thousand or more or a vinyl resin, and a medium,
   wherein the resin composition includes a composite resin particle constituted by a shell layer including the urethane resin and by a core layer including the vinyl resin;

(2) forming a plating-core pattern on the receiving layer by printing an ink on the receiving layer by reverse offset printing, the ink including a particle that serves as a plating core; and (3) depositing a metal on the plating-core pattern formed in the step (2) by electroless plating.

7. The method for forming a high-definition metal pattern according to claim 6,
wherein the urethane resin includes an alicyclic structure and a hydrophilic group, the content of the alicyclic structure being 2000 to 5500 mmol/kg relative to the total amount of the urethane resin.

8. The method for forming a high-definition metal pattern according to claim 7, wherein the particle that serves as a plating core is a metal nanoparticle having a mean volume diameter (Mv) of 2 to 100 nm, the metal nanoparticle being protected using an organic compound including a basic nitrogen atom and being dispersed in the ink.

9. The method for forming a high-definition metal pattern according to claim 7, wherein the ink further includes a fluorine-based surface-energy modifier and/or a silicone-based surface-energy modifier.

10. The method for forming a high-definition metal pattern according to claim 6,
wherein the vinyl resin is produced by polymerizing a vinyl monomer mixture of 10% to 70% by mass of methyl methacrylate and 10% to 50% by mass of a (meth)acrylic acid alkyl ester including an alkyl group having 2 to 12 carbon atoms.

11. The method for forming a high-definition metal pattern according to claim 10, wherein the particle that serves as a plating core is a metal nanoparticle having a mean volume diameter (Mv) of 2 to 100 nm, the metal nanoparticle being protected using an organic compound including a basic nitrogen atom and being dispersed in the ink.

12. The method for forming a high-definition metal pattern according to claim 10, wherein the ink further includes a fluorine-based surface-energy modifier and/or a silicone-based surface-energy modifier.

13. The method for forming a high-definition metal pattern according to claim 6, wherein the particle that serves as a plating core is a metal nanoparticle having a mean volume diameter (Mv) of 2 to 100 nm, the metal nanoparticle being protected using an organic compound including a basic nitrogen atom and being dispersed in the ink.

14. The method for forming a high-definition metal pattern according to claim 6, wherein the ink further includes a fluorine-based surface-energy modifier and/or a silicone-based surface-energy modifier.

15. The method for forming a high-definition metal pattern according to claim 6, wherein the reverse offset printing includes the steps of:
(i) forming a uniform ink film on a liquid-repellent surface of a blanket;
(ii) pressing a relief printing plate against the ink film to remove part of the ink which is brought into contact with the relief printing plate from the blanket; and
(iii) transferring the ink remaining on the blanket to a printing object to form a desired pattern.

16. The method for forming a high-definition metal pattern according to claim 7, wherein the reverse offset printing includes the steps of:
(i) forming a uniform ink film on a liquid-repellent surface of a blanket;
(ii) pressing a relief printing plate against the ink film to remove part of the ink which is brought into contact with the relief printing plate from the blanket; and
(iii) transferring the ink remaining on the blanket to a printing object to form a desired pattern.

\* \* \* \* \*